United States Patent
Matsuura et al.

(10) Patent No.: US 7,745,016 B2
(45) Date of Patent: Jun. 29, 2010

(54) WHITE ORGANIC ELECTROLUMINESCENCE DEVICE

(75) Inventors: Masahide Matsuura, Sodegaura (JP); Kenichi Fukuoka, Sodegaura (JP); Hiroshi Yamamoto, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 830 days.

(21) Appl. No.: 10/563,353

(22) PCT Filed: Jun. 24, 2004

(86) PCT No.: PCT/JP2004/009290
§ 371 (c)(1),
(2), (4) Date: Jan. 3, 2006

(87) PCT Pub. No.: WO2005/006816
PCT Pub. Date: Jan. 20, 2005

(65) Prior Publication Data
US 2006/0172147 A1   Aug. 3, 2006

(30) Foreign Application Priority Data
Jul. 11, 2003  (JP) .............................. 2003-195472

(51) Int. Cl.
*H01L 51/54* (2006.01)
*H05B 33/12* (2006.01)

(52) U.S. Cl. ........................ 428/690; 428/917; 313/504; 313/506; 257/40

(58) Field of Classification Search ................. 428/690, 428/917; 313/502–509
See application file for complete search history.

(56) References Cited

U.S. PATENT DOCUMENTS 6,224,966 B1 * 5/2001 Sakai et al. .................. 428/212

(Continued)

FOREIGN PATENT DOCUMENTS

EP  0 949 696 A2  10/1999

(Continued)

OTHER PUBLICATIONS

Lim et al., "Synthesis and characteristics of bis(2,4-dimethyl-8-quinolinolato)(triphenylsilanolato)aluminum (III): A potential hole-blocking material for the organic light-emitting diodes," Journal of Organometallic Chemistry, vol. 691, No. 12, pp. 2701-2707, Jun. 2006.*

*Primary Examiner*—D. Lawrence Tarazano
*Assistant Examiner*—Camie S Thompson
(74) *Attorney, Agent, or Firm*—Steptoe & Johnson LLP

(57) ABSTRACT

An organic electroluminescence device emitting white light which comprises at least two light emitting layers and an electron transporting layer comprising a heterocyclic derivative having nitrogen atom or silicon atom which are disposed between a pair of electrodes, wherein the energy gap of a host compound in each light emitting layer is in a specific range, the energy gap of the heterocyclic derivative having nitrogen atom or silicon atom in the electron transporting layer is in a specific range, and the ionization potential of the heterocyclic derivative having nitrogen atom or silicon atom in the electron transporting layer and the ionization potential of the host compound in the light emitting layer adjacent to the electron transporting layer satisfy a specific relation. The organic electroluminescence device provides a great efficiency of light emission under a low voltage and has a long lifetime, and exhibits no change in the chromaticity.

13 Claims, 2 Drawing Sheets

| Cathode |
|---|
| (Electron injecting layer) |
| Electron transporting layer (compound having nitrogen atom) |
| The first light emitting layer |
| The second light emitting layer |
| ... |
| The i-th light emitting layer |
| ... |
| The n-th light emitting layer |
| (Hole transporting layer) |
| (Hole injecting layer) |
| Anode |

U.S. PATENT DOCUMENTS

| | | | |
|---|---|---|---|
| 6,509,109 B1 * | 1/2003 | Nakamura et al. | 428/690 |
| 6,878,469 B2 * | 4/2005 | Yoon et al. | 428/690 |
| 6,967,062 B2 * | 11/2005 | Hatwar et al. | 428/690 |
| 7,037,601 B2 * | 5/2006 | Hatwar | 428/690 |
| 2002/0168544 A1 * | 11/2002 | Fukuoka et al. | 428/690 |
| 2003/0068524 A1 | 4/2003 | Hartwar | |
| 2003/0099860 A1 | 5/2003 | Lin et al. | |
| 2003/0215667 A1 * | 11/2003 | Xie | 428/690 |
| 2006/0257684 A1 * | 11/2006 | Arakane et al. | 428/690 |

FOREIGN PATENT DOCUMENTS

| | | |
|---|---|---|
| EP | 1 727 396 | 11/2006 |
| JP | 2002-216969 | 8/2002 |
| JP | 2002-343571 | 11/2002 |
| WO | WO02/088274 | 11/2002 |
| WO | WO2004/034751 A1 | 4/2004 |
| WO | 2004/047499 A1 | 6/2004 |

* cited by examiner

⊠ : Area of the white light in the CIE coordinates.

WHITE ORGANIC ELECTROLUMINESCENCE DEVICE

CLAIM OF PRIORITY

This application claims priority under 35 USC 371 to International Application No. PCT/JP2004/009290, filed on Jun. 24, 2004, which claims priority to Japanese Patent Application No. 2003-195472, filed on Jul. 11, 2003, the entire contents of which are hereby incorporated by reference.

TECHNICAL FIELD

The present invention relates to an organic electroluminescence device emitting white light, and more particularly to an organic electroluminescence device emitting white light which provides a great efficiency of light emission under a low voltage, has a long lifetime and exhibits no change in the chromaticity.

BACKGROUND ART

Organic electroluminescence (EL) devices which utilize organic substances are expected to be useful for application as inexpensive full color display devices of the solid light emission type having a great size, and various developments on the organic EL devices are being conducted. In general, an organic EL device has a construction comprising a light emitting layer and a pair of electrodes disposed at both sides of the light emitting layer. The light emission of the organic EL device is a phenomenon in which, when an electric field is applied between the two electrodes, electrons are injected from the cathode side and holes are injected from the anode side, the electrons are recombined with the holes in the light emitting layer to form an excited state, and energy generated when the excited state returns to the ground state is emitted as light.

Recently, organic EL devices emitting white light are attracting attention as the devices capable of the full color display using color filters in addition to applications as monocolor displays and lighting applications such as back light.

To produce the organic EL device emitting white light, a device having a light emitting layer of the laminate type which has a plural light emitting layer is proposed in Japanese Patent Application Laid-Open No. 2002-093583. In the organic EL device having the light emitting layer of the laminate type, white light is emitted by doping each light emitting layer with a dopant, and light other than white light can be emitted by changing the type of the dopant. However, the device having the light emitting layer of the laminate type has a problem in that the voltage necessary for the driving is great, the lifetime of light emission is short, and the chromaticity tends to change.

DISCLOSURE OF THE INVENTION

The present invention has been made to overcome the above problem and has an object of providing an organic EL device emitting white light which provides a great efficiency of light emission under a low voltage, has a long lifetime and exhibits no change in the chromaticity.

As the result of intensive studies by the present inventors to achieve the above object, it was found that the above object could be achieved when the energy gap of a host material comprised in each light emitting layer was in a specific range, the energy gap of a heterocyclic derivative having a nitrogen atom or a heterocyclic derivative having silicon atom comprised in the electron transporting layer was in a specific range, and the ionization potential of the heterocyclic derivative having nitrogen atom or the heterocyclic derivative having silicon atom comprised in the electron transporting layer and the ionization potential of the host compound comprised in the light emitting layer adjacent to the electron transporting layer satisfied a specific relation. The present invention has been completed based on the knowledge.

The present invention provides an organic electroluminescence device emitting white light which comprises a pair of electrodes, at least two light emitting layers and an electron transporting layer comprising a heterocyclic derivative having nitrogen atom or a heterocyclic derivative having silicon atom, the light emitting layers and the electron transporting layer being disposed between the pair of electrodes, wherein an energy gap of a host compound comprised in each light emitting layer Eg(Host-i) satisfies following relation (I):

$$2.9 \text{ eV} \leq \text{Eg(Host-}i) \tag{I}$$

wherein Eg(Host-i) represents an energy gap of a host compound comprised in an i-th light emitting layer from the electron transporting layer, i representing an integer of 1 to n, an energy gap of the heterocyclic derivative having nitrogen atom or the heterocyclic derivative having silicon atom comprised in the electron transporting layer Eg(ETM) satisfies following relation (II):

$$2.9 \text{ eV} < \text{Eg(ETM)} \tag{II}$$

and an ionization potential of a host compound comprised in a light emitting layer adjacent to the electron transporting layer (Ip(Host-1)) and an ionization potential of the heterocyclic derivative having nitrogen atom or the heterocyclic derivative having silicon atom comprised in the electron transporting layer (Ip(ETM)) satisfy following relation (III):

$$\text{Ip(ETM)} \leq \text{Ip(Host-1)} + 0.3 \text{ eV} \tag{III}$$

THE MOST PREFERRED EMBODIMENT TO CARRY OUT THE INVENTION

Figure 1:
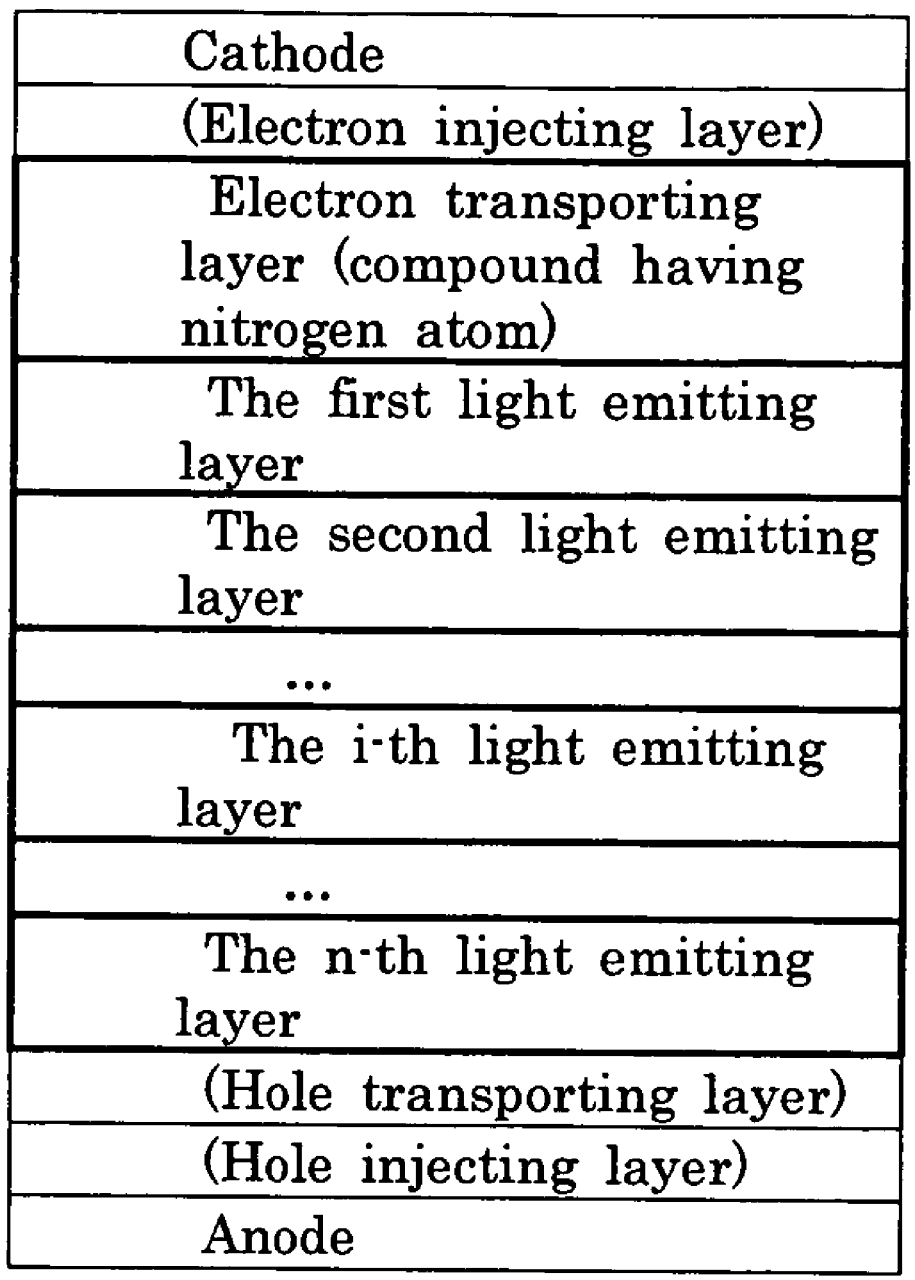
FIG. 1 shows a diagram exhibiting an embodiment of the construction of the organic EL device emitting white light of the present invention.

An embodiment of the construction of the layers in the organic EL device emitting white light of the present invention is shown in the diagram exhibited in FIG. 1. Specific examples are as follows:

(1) An anode/a light emitting layer/an electron transporting layer (/an electron injecting layer)/a cathode;
(2) An anode/(a hole injecting layer/) a hole transporting layer/a light emitting layer/an electron transporting layer (/an electron injecting layer)/a cathode;
(3) An anode/a layer emitting red light/a layer emitting blue light/an electron transporting layer (/an electron injecting layer)/a cathode;
(4) An anode/(a hole injecting layer/) a hole transporting layer/a layer emitting green to red light/a layer emitting blue light/an electron transporting layer (/an electron injecting layer)/a cathode;

(5) An anode/(a hole injecting layer/) a hole transporting layer/a layer emitting green to red light/a layer emitting white light/an electron transporting layer (/an electron injecting layer)/a cathode;

(6) An anode/a layer emitting blue light/a layer emitting green to red light/an electron transporting layer (/an electron injecting layer)/a cathode;

(7) An anode/(a hole injecting layer/) a hole transporting layer/a layer emitting blue light/a layer emitting green to red light/an electron transporting layer (/an electron injecting layer)/a cathode;

(8) An anode/(a hole injecting layer/) a hole transporting layer/a layer emitting white light/a layer emitting green to red light/an electron transporting layer (/an electron injecting layer)/a cathode; and (9) An anode/(a hole injecting layer/) a hole transporting layer/a layer emitting blue light/a layer emitting white light/an electron transporting layer (/an electron injecting layer)/a cathode.

Among these constructions of the device, constructions (6) to (9) are preferable, and construction (6) in which the layer emitting blue light is disposed at the side of the anode and the layer emitting green to red light is disposed at the side of the cathode is more preferable. The layer emitting white light means a light emitting layer emitting white light or light in the white area in the CIE chromaticity coordinates.

Figure 2:
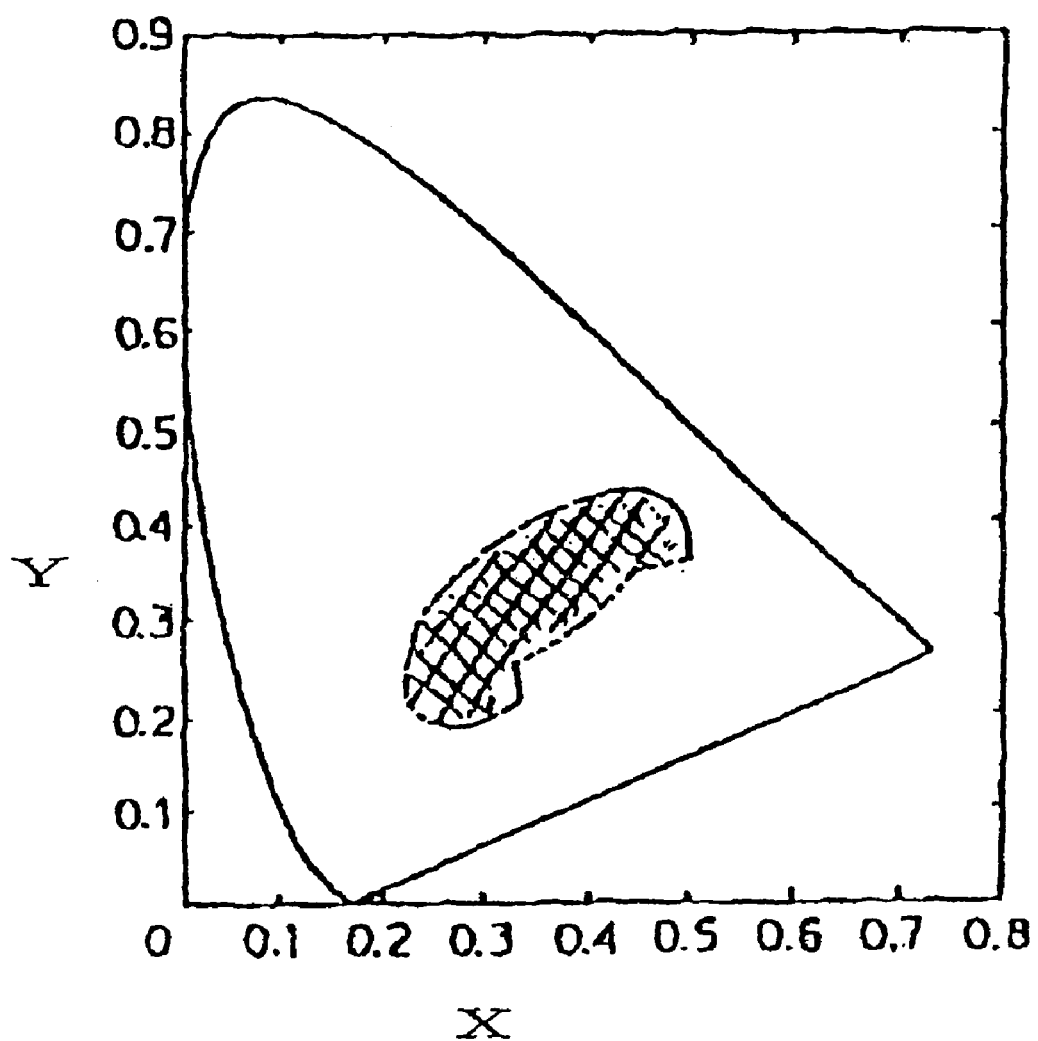
FIG. 2 shows a diagram exhibiting the area defining the white light in the CIE chromaticity coordinates.

Specifically, the layer emitting white light means a light emitting layer emitting light having a great half width (80 nm or greater) or light in the white area in the CIE chromaticity coordinates. The area defining the white light in the CIE chromaticity coordinates is exhibited in the diagram shown in FIG. 2. Examples of the layer emitting white light include light emitting layers of the laminate type such as "a light emitting layer emitting blue light/a light emitting layer emitting green to red light" and "a light emitting layer emitting green to red light/a light emitting layer emitting blue light" described above, and light emitting layers using a material or a dopant exhibiting a great half width of light emission such as those described in Japanese Patent Application Laid-Open No. Heisei 8(1996)-315983.

In the organic EL device of the present invention having the above construction, the energy gap of a host compound comprised in each light emitting layer Eg(Host-i) satisfies the following relation (I):

$$2.9 \text{ eV} \leq Eg(\text{Host-}i) \qquad (I)$$

wherein Eg(Host-i) represents an energy gap of a host compound comprised in an i-th light emitting layer from the electron transporting layer, i representing an integer of 1 to n, the energy gap of the heterocyclic derivative having nitrogen atom or the heterocyclic derivative having silicon atom comprised in the electron transporting layer Eg(ETM) satisfies the following relation (II):

$$2.9 \text{ eV} < Eg(\text{ETM}) \qquad (II)$$

and the ionization potential of a host compound comprised in the light emitting layer adjacent to the electron transporting layer (Ip(Host-1)) and the ionization potential of the heterocyclic derivative having nitrogen atom or the heterocyclic derivative having silicon atom comprised in the electron transporting layer (Ip(ETM)) satisfy the following relation (III):

$$Ip(\text{ETM}) \leq Ip(\text{Host-1}) + 0.3 \text{ eV} \qquad (III)$$

It is preferable that the following relations are satisfied:

$$Eg(\text{Host-}i) < 3.2 \text{ eV}$$

$$Eg(\text{ETM}) < 3.2 \text{ eV}$$

The above energy gap can be obtained by preparing a dilute solution (a concentration of about $10^{-5}$ M) of the object organic substance and calculating the energy gap based on the end portion of the absorption spectrum of the prepared solution at the side of the long wavelength.

The above ionization potential can be measured, for example, as follows. The object organic substance is irradiated with light from a heavy hydrogen lamp via a monochromator for spectral diffraction, and a curve showing the change in the discharge of photoelectrons with the photon energy of irradiation is obtained. The threshold value of the discharge of photoelectrons is obtained from the curve in accordance with the extrapolation method.

In the organic EL device of the present invention, the host compound in the light emitting layer satisfies the above relation (I), the heterocyclic derivative having nitrogen atom or the heterocyclic derivative having silicon atom in the electron transporting layer satisfies the above relation (II), and the ionization potential of the host compound in the light emitting layer adjacent to the electron transporting layer and the ionization potential of the heterocyclic derivative having nitrogen atom or the heterocyclic derivative having silicon atom in the electron transporting layer satisfy the above relation (III). Due to this condition, the hole barrier is optimized and is not excessively great or excessively small. No decrease in the hole injecting property or the electron injecting property takes place, and the holes and the electrons are very efficiently recombined in the light emitting layer. Thus, the organic EL device of the present invention provides a great efficiency of light emission even under a low voltage, has a long lifetime and exhibits no change in the chromaticity.

It is preferable that relation (III) is expressed as:

$$Ip(\text{ETM}) \leq Ip(\text{Host-1}) + 0.2 \text{ eV}$$

and more preferably as:

$$Ip(\text{ETM}) \leq Ip(\text{Host-1}) + 0.1 \text{ eV}.$$

In the organic EL device of the present invention, it is preferable that the energy gap of the host compound comprised in each light emitting layer Eg(Host-i) and the energy gap of the heterocyclic derivative having nitrogen atom or the heterocyclic derivative having silicon atom comprised in the electron transporting layer Eg(ETM) satisfy the following relation (IV):

$$2.9 \text{ eV} < Eg(\text{ETM}) \leq Eg(\text{Host-}i) \qquad (IV)$$

while the above relations (I) to (III) are satisfied.

In the organic EL device of the present invention, it is preferable that at least one light emitting layer comprises a dopant having an energy gap Eg(Dop-i), i representing an integer of 1 to n, of 2.9 eV or smaller. It is more preferable that the energy gap Eg of the light emitting layer forming the interface with the electron transporting layer is smaller than 2.65 eV, or at least one layer among the light emitting layers not forming the interface with the electron transporting layer, i.e., having a value of i of 2 or greater, comprises a dopant having the energy gap satisfying the following relation (V):

$$2.65 \text{ eV} < Eg(\text{Dop-}i) \leq 2.9 \text{ eV} \qquad (V)$$

The device can emit light with stability when the above conditions are satisfied.

The concentration of the dopant in the light emitting layer is not particularly limited. The concentration of the dopant is preferably 0.05 to 15% by weight and more preferably 0.1 to 10% by weight. A single light emitting layer may be doped with a plural type of dopant.

The device emitting white light can be obtained by the combination of two or three light emitting layers emitting different colors. It is necessary for this construction that at least one dopant is added. There is the possibility that the change in the color tone takes place before the light is obtained at the anode side due to the absorption of the emitted light with the dopant and the re-emission of light thereafter. This change can be decreased when the energy gap of the dopant in at least one layer among the light emitting layers not forming the interface with the electron transporting layer, i.e., having the value of i of 2 or greater, satisfies the above relation (V).

It is not necessary that a single dopant is used in each light emitting layer in the present invention, and a plural dopant can be used so that the efficiency can be increased and the color tone can be adjusted. Examples of the form of doping include (a) partial doping of the same host compound, (b) combinations of different host compounds and different dopants and combinations of (a) and (b).

It is preferable that the organic EL device of the present invention comprises two or more light emitting layers having different peak wavelengths of light emission. It is more preferable that each light emitting layer comprises the above dopant. It is still more preferable that the difference between the peak wavelength of the greatest light emission and the peak wavelength of the second greatest light emission is 50 nm or greater.

To drive the organic EL device emitting white light under a lower voltage and to increase the efficiency, it is preferable that the electron transporting layer or an interfacial region between the electron transporting layer and the cathode comprises a metal having a work function of 2.8 eV or smaller or a compound of the metal. Examples of the metal include alkali metals and alkaline earth metals such as Na, K, Rb, Cs, Ca, Sr and Ba.

To achieve the stable light emission and increase the efficiency of light emission of the organic EL device, a plural electron transporting layer may be disposed, or a layer of an inorganic compound may be disposed between the anode and the light emitting layer or between the cathode and the electron transporting layer. Examples of the inorganic compound used in the layer of an inorganic compound include various oxides, nitrides, oxide nitrides and halides such as oxides of alkali metals, oxides of alkaline earth metals, oxides of rare earth metals, halides of alkali metals, halides of alkaline earth metals, oxides of rare earth metals, $SiO_x$, $AlO_x$, $SiN_x$, $SiON$, $AlON$, $GeO_x$, $LiO_x$, $LiON$, $TiO_x$, $TiON$, $TaO_x$, $TaON$, $TaN_x$, C, LiF, $MgF_2$, $CaF_2$, $MgF_2$ and NaF.

As the layer disposed between the anode and the light emitting layer, layers comprising $SiO_x$, $AlO_x$, $SiN_x$, $SiON$, $AlON$, $GeO_x$ and C are preferable. As the layer disposed between the cathode and the electron transporting layer, layers comprising LiF, $MgF_2$, $CaF_2$, $MgF_2$ and NaF are preferable.

An oxidizing agent may be added into the organic layer adjacent to the anode. As the oxidizing agent, electron-attracting or electron-accepting oxidizing agents are preferable. Examples of such oxidizing agents include Lewis acids, various quinone derivatives, dicyanoquino-dimethane derivatives and salts formed with aromatic amines and Lewis acids. Examples of the Lewis acid include iron chlorides, antimony chloride and aluminum chloride. A reducing agent may be added to the organic layer adjacent to the cathode. Examples of the reducing agent include alkali metals, alkaline earth metals, oxides of alkali metals, oxides of alkaline earth metals, oxides of rare earth metals, halides of alkali metals, halides of alkaline earth metals and halides of rare earth metals. Among the alkali metals, Cs, Li, Na and K are preferable.

The light emitting material (the host material) which can be used for the light emitting layer is not particularly limited, and any material can be used as long as the material satisfies the above relation (I). Specifically, conventional materials emitting blue light can be used. The light emitting property of the light emitting material is not particularly limited. Any of the conventional fluorescent materials and the conventional phosphorescent materials may be used.

Specific examples of the material emitting blue light include anthracene derivatives, styryl derivatives, aromatic amines, aluminum chelates having mixed ligands and carbazole derivatives.

As the anthracene derivative, compounds having the phenyl-anthracene skeleton structure are preferable.

As the styryl derivative, distyryl derivatives, tristyryl derivatives, tetrastyryl derivatives and styrylamine derivatives are preferable.

As the aromatic amine, compounds having 2 to 4 nitrogen atoms substituted with an aromatic group are preferable, and compounds having 2 to 4 nitrogen atoms substituted with an aromatic group and at least one alkenyl group are more preferable.

Examples of the aluminum chelates having mixed ligands include bis($R^5$-8-quinolinolato)(phenolato)aluminum(III) chelates represented by the following formula [viii]:

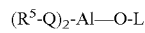

$(R^5-Q)_2-Al-O-L$ [viii]

In the above formula, Q represents a substituted 8-quinolinolato ligand, $R^5$ represents a substituent to the 8-quinolinolato ring, O-L represents a phenolato ligand, and L represents a hydrocarbon group having an aryl portion.

As the aluminum chelate having mixed ligands, the following compounds are preferable:

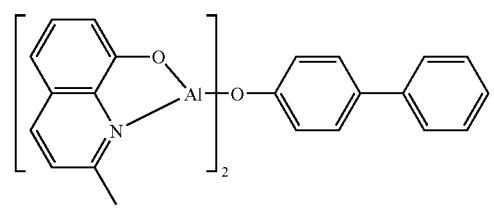

Eg(ETM) = 3.0eV

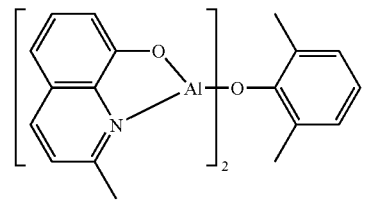

Eg(ETM) = 3.0eV

As the carbazole derivative, the following compound is preferable:

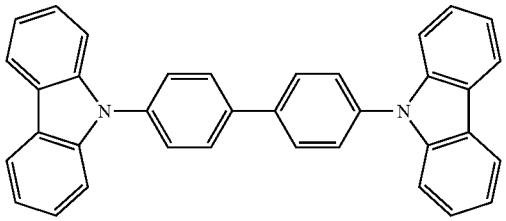

Eg(ETM) = 3.6eV

Examples of the anthracene derivative include compounds represented by the following general formulae [i] to [v]:

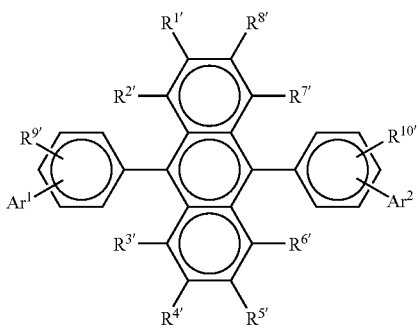

[i]

In the above general formula [i], $R^{1'}$ to $R^{10'}$ each independently represent hydrogen atom, a halogen atom, cyano group, nitro group, a substituted or unsubstituted alkyl group having 1 to 20 carbon atom, a substituted or unsubstituted alkoxyl group having 1 to 20 carbon atoms, a substituted or unsubstituted aryloxyl group having 6 to 30 carbon atoms, a substituted or unsubstituted alkylthio group having 1 to 20 carbon atoms, a substituted or unsubstituted arylthio group having 6 to 30 carbon atoms, a substituted or unsubstituted arylalkyl group having 7 to 30 carbon atoms, a substituted or unsubstituted monocyclic group having 5 to 30 carbon atoms, a substituted or unsubstituted condensed polycyclic group having 10 to 30 carbon atoms or a substituted or unsubstituted heteroaryl group having 5 to 30 carbon atoms.

$Ar^{1'}$ and $Ar^{2'}$ each independently represent a substituted or unsubstituted aryl group having 6 to 30 carbon atoms or a substituted or unsubstituted alkenyl group having 1 to 20 carbon atoms. Examples of the substituent include substituted and unsubstituted alkyl groups having 1 to 20 carbon atom, substituted and unsubstituted alkoxyl groups having 1 to 20 carbon atoms, substituted and unsubstituted aryloxyl groups having 6 to 30 carbon atoms, substituted and unsubstituted alkylthio groups having 1 to 20 carbon atoms, substituted and unsubstituted arylthio groups having 6 to 30 carbon atoms, substituted and unsubstituted arylalkyl groups having 7 to 30 carbon atoms, substituted and unsubstituted monocyclic groups having 5 to 30 carbon atoms, substituted and unsubstituted condensed polycyclic groups having 10 to 30 carbon atoms and substituted and unsubstituted heteroaryl groups having 5 to 30 carbon atoms.

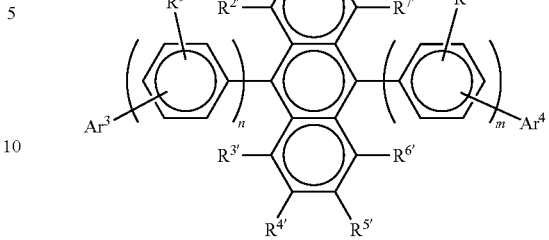

[ii]

In the above general formula [ii], $R^{1'}$ to $R^{10'}$ are as defined above.

$Ar^{3'}$ and $Ar^{4'}$ each independently represent a substituted or unsubstituted aryl group having 6 to 30 carbon atoms or a substituted or unsubstituted alkenyl group having 1 to 20 carbon atoms. Examples of the substituent include substituted and unsubstituted alkyl groups having 1 to 20 carbon atom, substituted and unsubstituted alkoxyl groups having 1 to 20 carbon atoms, substituted and unsubstituted aryloxyl groups having 6 to 30 carbon atoms, substituted and unsubstituted alkylthio groups having 1 to 20 carbon atoms, substituted and unsubstituted arylthio groups having 6 to 30 carbon atoms, substituted and unsubstituted arylalkyl groups having 7 to 30 carbon atoms, substituted and unsubstituted monocyclic groups having 5 to 30 carbon atoms, substituted and unsubstituted condensed polycyclic groups having 10 to 30 carbon atoms, substituted and unsubstituted heteroaryl groups having 5 to 30 carbon atoms and substituted and unsubstituted alkenyl groups having 4 to 40 carbon atoms. n' represents a number of 1 to 3, m' represents a number of 1 to 3, and n'+m'≧2.

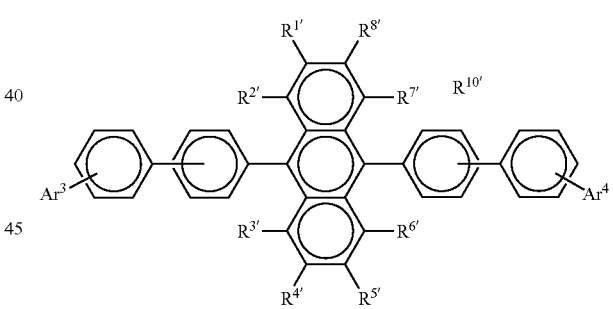

[iii]

In the above general formula (iii), $R^{1'}$ to $R^{8'}$, $Ar^{3'}$ and $Ar^{4'}$ are as defined above.

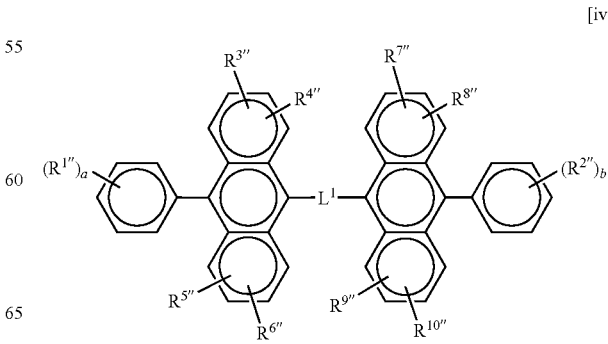

[iv]

In the above general formula (iv), $R^{1''}$ to $R^{10''}$ each independently represent hydrogen atom, a substituted or unsubstituted alkenyl group having 1 to 20 carbon atoms, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, a substituted or unsubstituted alkoxyl group having 1 to 20 carbon atoms, a substituted or unsubstituted aryloxyl group having 6 to 30 carbon atoms, a substituted or unsubstituted alkylamino group having 1 to 20 carbon atoms, a substituted or unsubstituted arylamino group having 1 to 40 carbon atoms or a substituted or unsubstituted heteroaryl group having 5 to 30 carbon atoms, and a and b each represent an integer of 1 to 5. When a or b represents an integer of 2 or greater, atoms or groups represented by a plural $R^{1''}$ or a plural $R^{2''}$, respectively, may be the same with or different from each other, and groups represented by a plural $R^{1''}$ or a plural $R^{2''}$, respectively, may bond to each other to form a ring. A pair of groups represented by $R^{3''}$ and $R^{4''}$, $R^{5''}$ and $R^{6''}$, $R^{7''}$ and $R^{8''}$ or $R^{9''}$ and $R^{10''}$ may bond to each other to form a ring. $L^1$ represents a single bond, —O—, —S—, —N(R)—, R representing an alkyl group or an aryl group which may be substituted, or an arylene group.

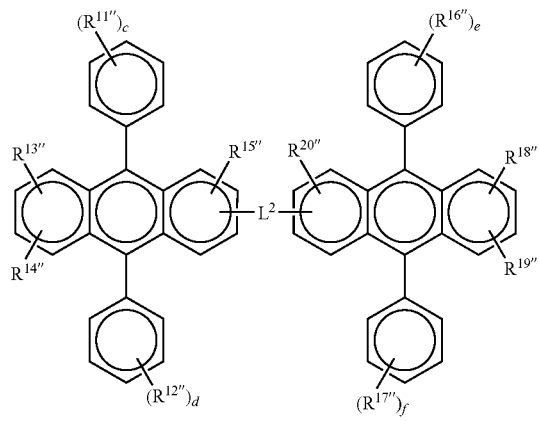

[v]

In the above general formula (v), $R^{11''}$ to $R^{20''}$ each independently represent an atom or a group which is the same as that represented by $R^{1''}$ to $R^{10''}$; and c, d, e and f each represent an integer of 1 to 5. When c, d, e or f represents an integer of 2 or greater, atoms or groups represented by a plural $R^{11''}$, a plural $R^{12''}$, a plural $R^{16''}$ or a plural $R^{17''}$ respectively, may be the same with or different from each other, and groups represented by a plural $R^{11''}$, a plural $R^{12''}$, a plural $R^{16''}$ or a plural $R^{17''}$, respectively, may bond to each other to form a ring. A pair of groups represented by $R^{13''}$ and $R^{14''}$ or $R^{18''}$ and $R^{19''}$ may bond to each other to form a ring. $L^2$ represents a single bond, an atom or a group which is the same as that represented by $L^1$.

Specific examples of the groups represented by the above general formulae (i) to (v) include the following groups.

Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group, cyclopropyl group.

The alkoxyl group is a group represented by —OY. Examples of the group represented by Y include the groups described as the examples of the alkyl group.

The alkylthio group is a group represented by —SY. Examples of the group represented by Y include the groups described as the examples of the alkyl group.

Examples of the aryl group include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group and 4''-t-butyl-p-terphenyl-4-yl group.

The aryloxyl group is a group represented by —OZ'. Examples of the group represented by Z' include the groups described as the examples of the aryl group.

The arylthio group is a group represented by —SZ'. Examples of the group represented by Z' include the groups described as the examples of the aryl group.

Examples of the arylalkyl group include benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

Examples of the monocyclic group include groups derived from cyclopentane, cyclohexane and cycloheptane.

Examples of the condensed polycyclic group include groups derived from anthracene, naphthalene, phenanthrene, pyrene, tetracene, coronen, chrysene, fluoresceine and perylene.

Examples of the heteroaryl group include 1-azaindolidin-2-yl group, 1-azaindolidin-3-yl group, 1-azaindolidin-5-yl group, 1-azaindolidin-6-yl group, 1-azaindolidin-7-yl group, 1-azaindolidin-8-yl group, 2-azaindolidin-1-yl group, 2-azaindolidin-3-yl group, 2-azaindolidin-5-yl group, 2-azaindolidin-6-yl group, 2-azaindolidin-7-yl group, 2-azaindolidin-8-yl group, 6-azaindolidin-1-yl group, 6-azaindolidin-2-yl group, 6-azaindolidin-3-yl group, 6-azaindolidin-5-yl group, 6-azaindolidin-7-yl group, 6-azaindolidin-8-yl group, 7-azaindolidin-1-yl group, 7-azaindolidin-2-yl group, 7-azaindolidin-3-yl group, 7-azaindolidin-5-yl group, 7-azaindolidin-6-yl group, 7-azaindolidin-7-yl group, 7-azaindolidin-8-yl group, 8-azaindolidin-1-yl group, 8-azaindolidin-2-yl group, 8-azaindolidin-3-yl group, 8-azaindolidin-5-yl group, 8-azaindolidin-6-yl group, 8-azaindolidin-7-yl group, 1-indolidinyl group, 2-indolidinyl group, 3-indolidinyl group, 5-indolidinyl group, 6-indolidinyl group, 7-indolidinyl group, 8-indolidinyl group, 1-pyrrolyl group, 2-pyrrolyl group, 3-pyrrolyl group, pyradinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the alkenyl group include vinyl group, allyl group, 1-butenyl group, 2-butenyl group, 3-butenyl group, 1,3-butadienyl group, 1-methylvinyl group, styryl group, 2,2-diphenylvinyl group, 2,2-ditolylvinyl group, 1,2-ditolylvinyl group, 1-methylallyl group, 1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group.

Examples of the cycloalkyl group include cyclopropyl group, cyclobutyl group, cyclopentyl group, cyclohexyl group and 4-methylcyclohexyl group.

Examples of the arylamino group include diphenylamino group, ditolylamino group, dinaphthylamino group and naphthylphenylamino group.

Examples of the alkylamino group include dimethylamino group, diethylamino group and dihexylamino group.

Examples of the styryl derivative and the aromatic amine include compounds represented by the following general formulae [vi] and [vii]:

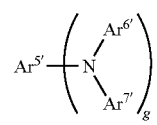

[vi]

In the above general formula [vi], $Ar^{5'}$, $Ar^{6'}$ and $Ar^{7'}$ each independently represent a substituted or unsubstituted aromatic group having 6 to 40 carbon atoms, at least one of which may have styryl group, and g represents an integer of 1 to 4.

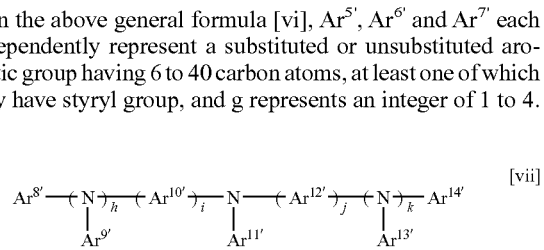

[vii]

In the above general formula [vii], $Ar^{8'}$, $Ar^{9'}$, $Ar^{11'}$, $Ar^{13'}$ and $Ar^{14'}$ each independently represent a substituted or unsubstituted monovalent aromatic group having 6 to 40 carbon atoms, $Ar^{10'}$ and $Ar^{12'}$ each independently represent a substituted or unsubstituted divalent aromatic group having 6 to 40 carbon atoms, at least one of the groups represented by $Ar^{8'}$ to $Ar^{14'}$ may have styryl group or styrylene group, and h and k each represent an integer of 0 to 2.

Examples of the aromatic group include groups derived from benzene, naphthalene, anthracene, phenanthrene, pyrene, coronen, biphenyl, terphenyl, pyrrol, furan, thiophene, benzothiophene, oxadiazoline, diphenylanthracene, indoline, carbazole, pyridine, benzoquinone, fluoranthene and acenaphthofluoranthene.

In the following, the dopant which can be added to the light emitting layer in the organic EL device of the present invention will be described. The dopant include dopants for the blue color and dopants for the yellow to red color.

The dopant for the blue color is not particularly limited. Dopants satisfying the above relation (V) are preferable.

Examples of the dopant for the blue color include styrylamine, styrylamine compounds substituted with an amine and compounds having a condensed aromatic ring.

Examples of the styryl amine and the styrylamine compound substituted with an amine include compounds represented by the following general formulae [ix] and [x]. Examples of the compound having a condensed aromatic ring include compounds represented by general formula [ix] shown also in the following.

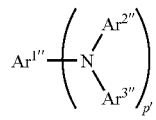

[ix]

In the above general formula [ix], $Ar^{1''}$, $Ar^{2''}$ and $Ar^{3''}$ each independently represent a substituted or unsubstituted aromatic group having 6 to 40 carbon atoms, at least one of which has styryl group, and p' represents an integer of 1 to 3.

Examples of the aromatic group include the groups described above as the examples of the aromatic group.

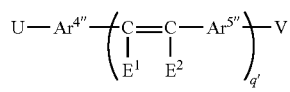

[x]

In the above general formula [x], $Ar^{4''}$ and $Ar^{5''}$ each independently represent an arylene group having 6 to 30 carbon atoms, $E^1$ and $E^2$ each independently represent an aryl group having 6 to 30 carbon atoms, an alkyl group, hydrogen atom or cyano group, q' represents an integer of 1 to 3, and U and/or V represents a substituent including an amino group. It is preferable that the amino group is an arylamino group.

Examples of the arylene group include divalent derivatives of the groups described above as the examples of the aryl group. Examples of the aryl group, the alkyl group and the arylamino group include the groups described above as the examples of the corresponding groups.

$(A)_r$-B [xi]

In the above general formula [xi], A represents an alkyl group or alkoxyl group having 1 to 16 carbon atoms, a substituted or unsubstituted aryl group having 6 to 30 carbon atoms, a substituted or unsubstituted alkylamino group having 6 to 30 carbon atoms or a substituted or unsubstituted arylamino group having 6 to 30 carbon atoms, B represents a condensed aromatic cyclic group having 10 to 40 carbon atoms, and r represents an integer of 1 to 4.

Examples of the alkyl group, the alkoxyl group, the aryl group, the alkylamino group and the arylamino group include the groups described above as the examples of the corresponding groups.

Other compounds such as fluoresceine derivatives, perylene derivatives and coumarine derivatives can be used.

Complex compounds shown in the following are also preferable as the dopant.

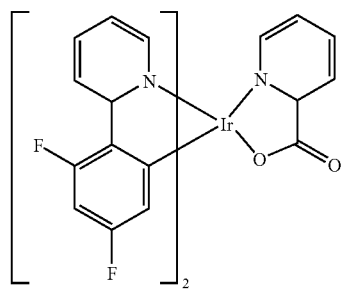

The dopant for a green to red color is not particularly limited. Compounds having an energy gap smaller than 2.65 eV are preferable. Examples of the dopant for a green to red color include fluorescent compounds having a skeleton structure of fluoranthene or perylene. Preferable examples include compounds represented by the following general formulae [1] to [18].

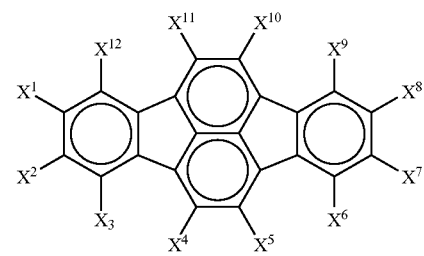

[1]

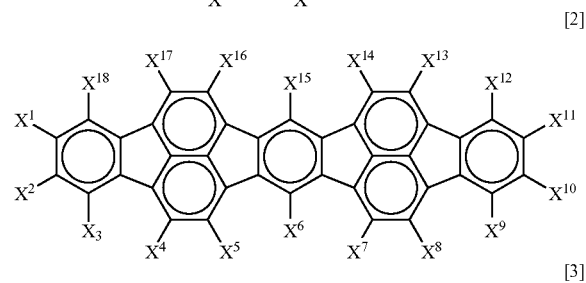

[2]

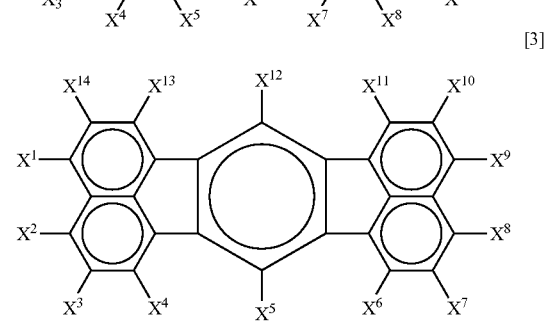

[3]

-continued

-continued

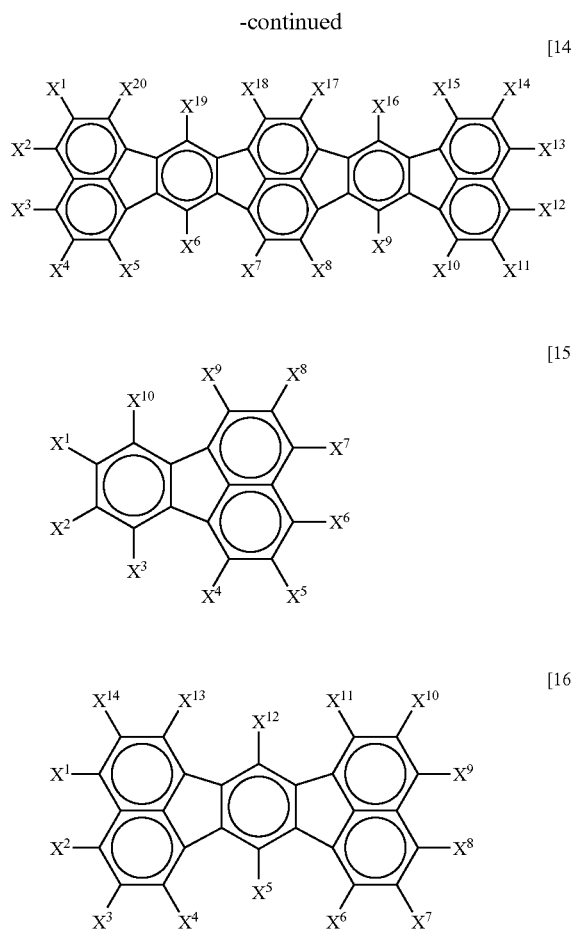

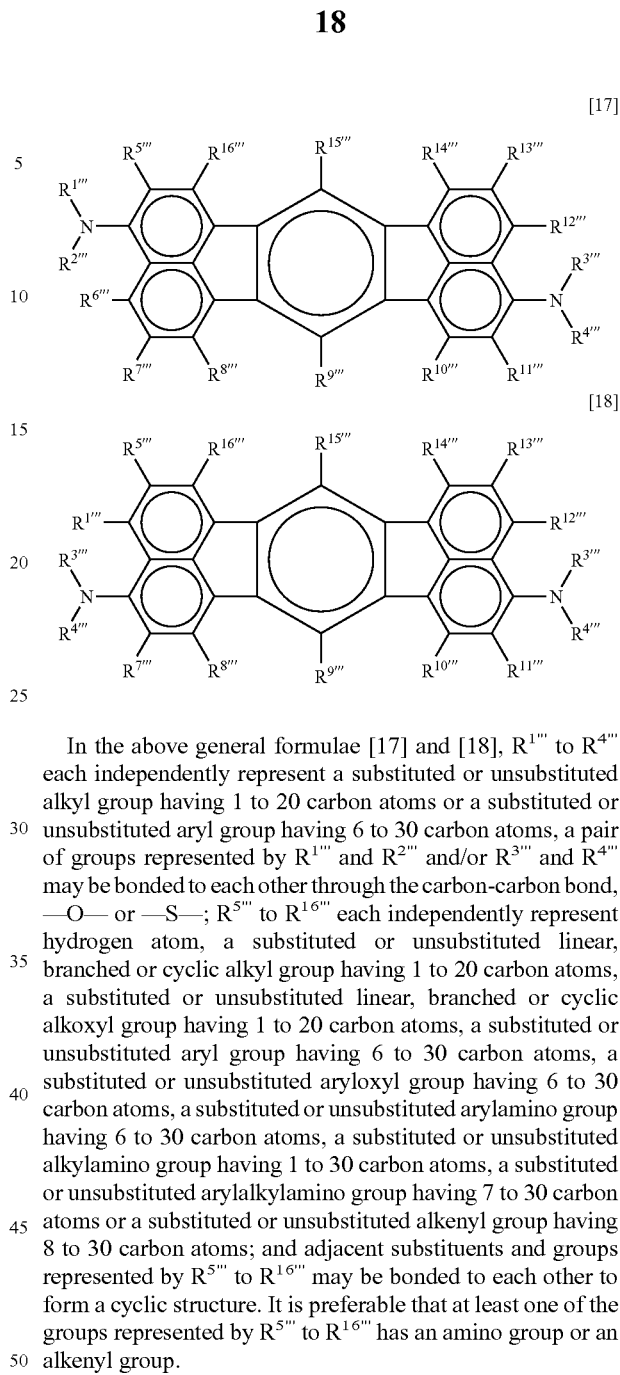

In the above general formulae [1] to [16], $X^1$ to $X^{20}$ each independently represent hydrogen atom, a substituted or unsubstituted linear, branched or cyclic alkyl group having 1 to 20 carbon atoms, a substituted or unsubstituted linear, branched or cyclic alkoxyl group having 1 to 20 carbon atoms, a substituted or unsubstituted aryl group having 6 to 30 carbon atoms, a substituted or unsubstituted aryloxyl group having 6 to 30 carbon atoms, a substituted or unsubstituted arylamino group having 6 to 30 carbon atoms, a substituted or unsubstituted alkylamino group having 1 to 30 carbon atoms, a substituted or unsubstituted arylalkylamino group having 7 to 30 carbon atoms or a substituted or unsubstituted alkenyl group having 8 to 30 carbon atoms; adjacent substituents and groups represented by $X^1$ to $X^{20}$ may be bonded to each other to form a cyclic structure; and when adjacent substituents are aryl groups, the substituents may be the same with each other.

Examples of the alkyl group, the alkoxyl group, the aryl group, the aryloxyl group, the arylamino group, the alkylamino group and the alkenyl group include the groups described above as the examples of the corresponding groups. Examples of the arylalkylamino group include groups obtained by substituting hydrogen atom in an amino group with the alkyl group or the aryl group which is described above.

In the above general formulae [17] and [18], $R^{1'''}$ to $R^{4'''}$ each independently represent a substituted or unsubstituted alkyl group having 1 to 20 carbon atoms or a substituted or unsubstituted aryl group having 6 to 30 carbon atoms, a pair of groups represented by $R^{1'''}$ and $R^{2'''}$ and/or $R^{3'''}$ and $R^{4'''}$ may be bonded to each other through the carbon-carbon bond, —O— or —S—; $R^{5'''}$ to $R^{16'''}$ each independently represent hydrogen atom, a substituted or unsubstituted linear, branched or cyclic alkyl group having 1 to 20 carbon atoms, a substituted or unsubstituted linear, branched or cyclic alkoxyl group having 1 to 20 carbon atoms, a substituted or unsubstituted aryl group having 6 to 30 carbon atoms, a substituted or unsubstituted aryloxyl group having 6 to 30 carbon atoms, a substituted or unsubstituted arylamino group having 6 to 30 carbon atoms, a substituted or unsubstituted alkylamino group having 1 to 30 carbon atoms, a substituted or unsubstituted arylalkylamino group having 7 to 30 carbon atoms or a substituted or unsubstituted alkenyl group having 8 to 30 carbon atoms; and adjacent substituents and groups represented by $R^{5'''}$ to $R^{16'''}$ may be bonded to each other to form a cyclic structure. It is preferable that at least one of the groups represented by $R^{5'''}$ to $R^{16'''}$ has an amino group or an alkenyl group.

Examples of the alkyl group, the alkoxyl group, the aryl group, the aryloxyl group, the arylamino group, the alkylamino group and the alkenyl group include the groups described above as the examples of the corresponding groups. Examples of the arylalkylamino group include groups obtained by substituting hydrogen atom in an amino group with the alkyl group or the aryl group which is described above.

As other compounds which can be used as the dopant for a yellow to red color, for example, dicyanomethylenepyran derivatives, dicyanomethylenethiopyran derivatives, fluoresceine derivatives, perylene derivatives and coumarine derivatives which are described in European Patent Application Laid-Open No. 0281381 and used as red or reddish laser dyes are also preferable. Examples of the compound include the following compounds:

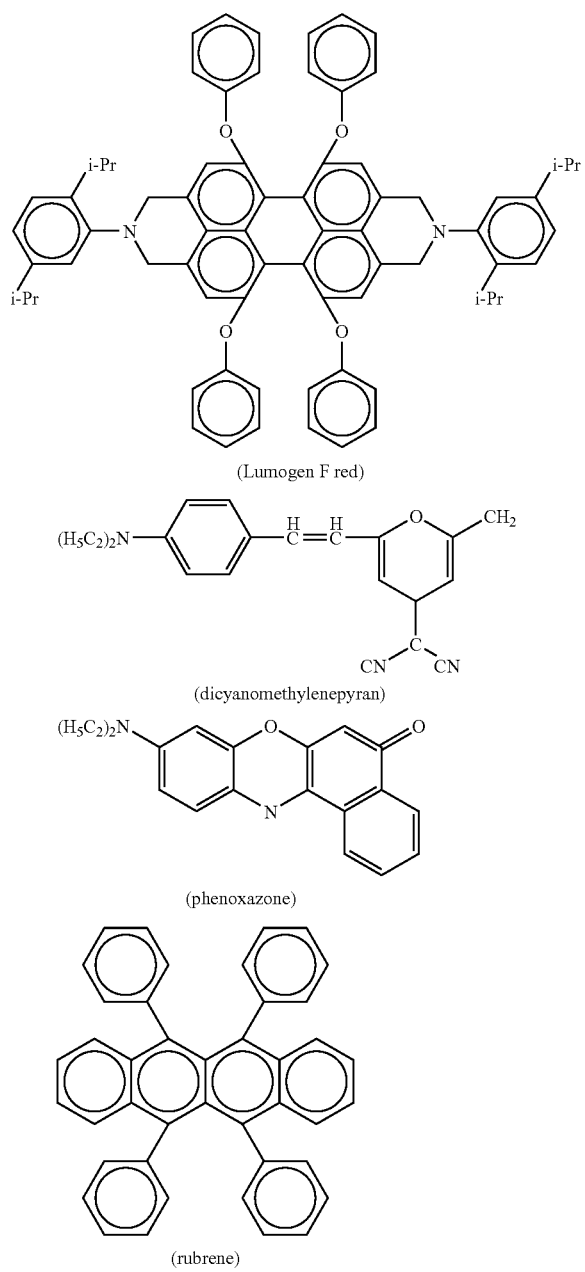
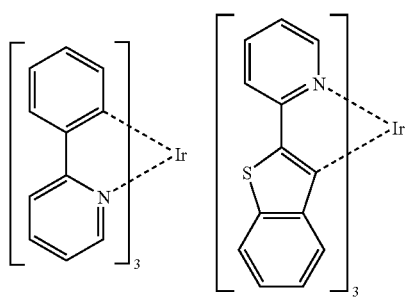

Lumogen F red: Eg(ETM) = 2.0 eV
rubrene: Eg(ETM) = 2.2 ev

Other compounds such as:

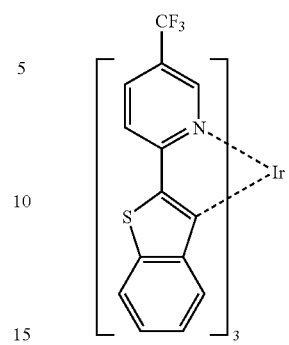

can also be used.

In the following, the heterocyclic compound having nitrogen atom which is comprised in the electron transporting layer in the present invention will be described.

It is preferable that the electron transporting layer in the organic EL device of the present invention comprises a heterocyclic compound having nitrogen atom represented by the following general formula (1):

$$HAr\text{-}L\text{-}Ar^1\text{—}Ar^2 \quad (1)$$

wherein HAr represents a substituted or unsubstituted heterocyclic group having nitrogen atom, $Ar^1$ represents a substituted or unsubstituted divalent aromatic hydrocarbon group having 6 to 40 carbon atoms, $Ar^2$ represents a substituted or unsubstituted aryl group having 6 to 40 carbon atoms or a substituted or unsubstituted heteroaryl group having 3 to 40 carbon atoms, and L represents a single bond or a substituted or unsubstituted arylene group.

It is preferable that, in the above general formula (1), HAr represents a heterocyclic group represented by one of the following formulae (2) to (24):

(2)

(3)

(4)

(5)

-continued

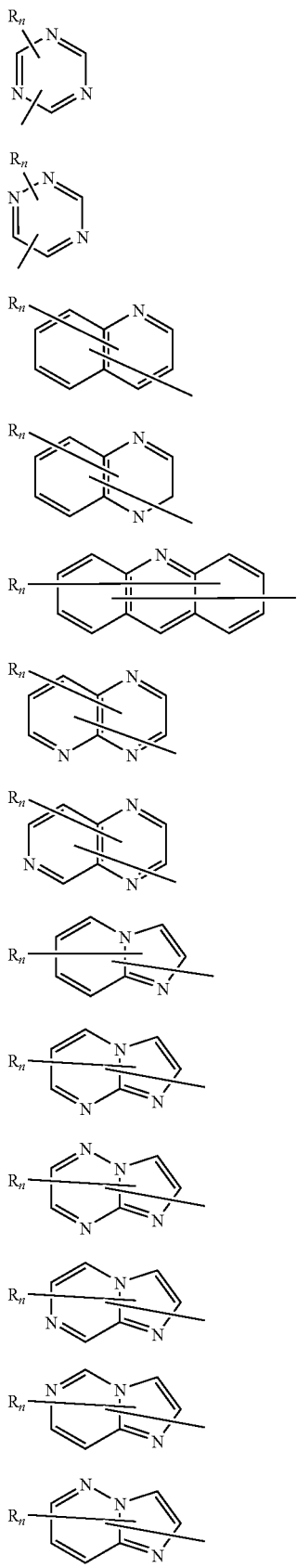

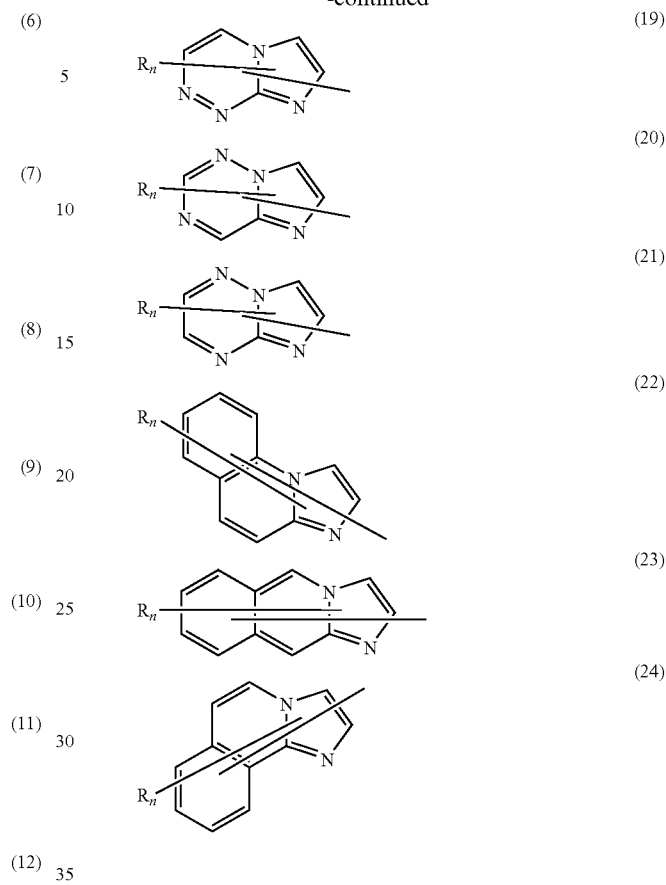

wherein R represents a substituted or unsubstituted aryl group having 6 to 40 carbon atoms, a substituted or unsubstituted heteroaryl group having 3 to 40 carbon atoms, a substituted or unsubstituted alkyl group having 1 to 20 carbon atoms or a substituted or unsubstituted alkoxyl group having 1 to 20 carbon atoms, n represents an integer of 0 to 5 and, when n represents an integer of 2 or greater, a plural R may represent the same group or different groups, and a plural group represented by R may be bonded to each other to form a cyclic structure; and the following formula (A):

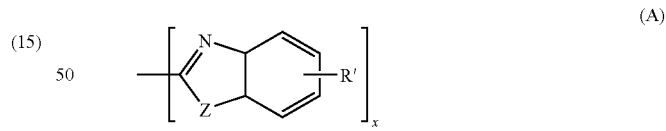

wherein a plural $R^1$ each independently represent hydrogen atom, a halogen atom, a substituted or unsubstituted alkyl group having 1 to 20 carbon atoms, a substituted or unsubstituted aryl group having 6 to 40 carbon atoms, a substituted or unsubstituted heteroaryl group having 3 to 40 carbon atoms or a group forming a condensed aromatic group, Z represents oxygen atom, sulfur atom or a group represented by NR', R' representing the same atom or group as that represented by $R^1$, and x represents an integer of 2 to 8;

or a substituted or unsubstituted carbazolyl group.

Examples of the aryl group, the heteroaryl group, the alkyl group and the alkoxyl group include the groups described above as the examples of the corresponding groups.

Examples of the substituent to carbazolyl group include the groups described above as the examples of the groups represented by R'.
It is more preferable that HAr represents a group expressed by one of the following formulae (25) to (44):
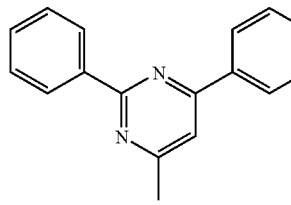
(25)
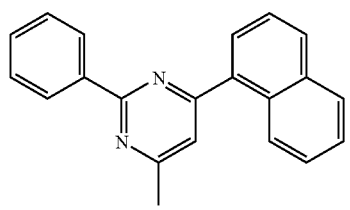
(26)
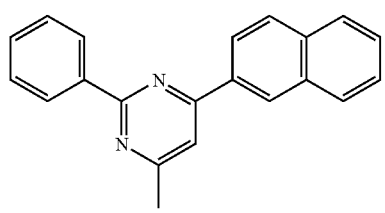
(27)
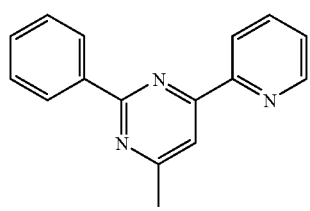
(28)
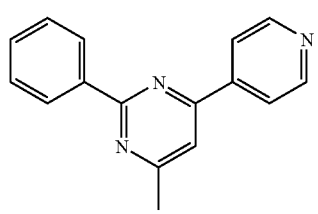
(29)
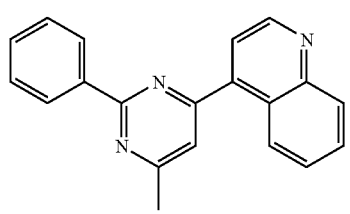
(30)
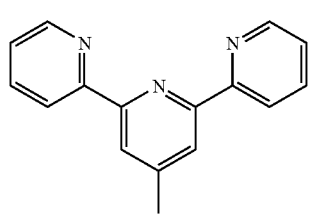
(31)
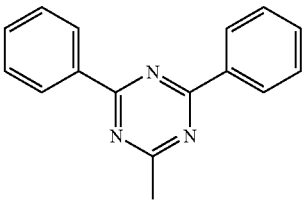
(32)
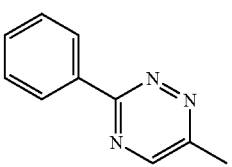
(33)
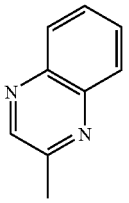
(34)
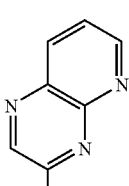
(35)
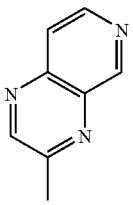
(36)
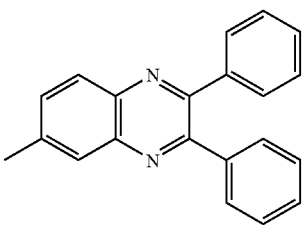
(37)
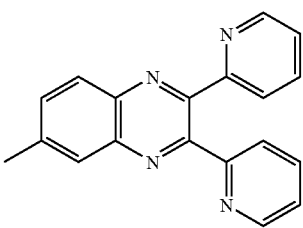
(38)

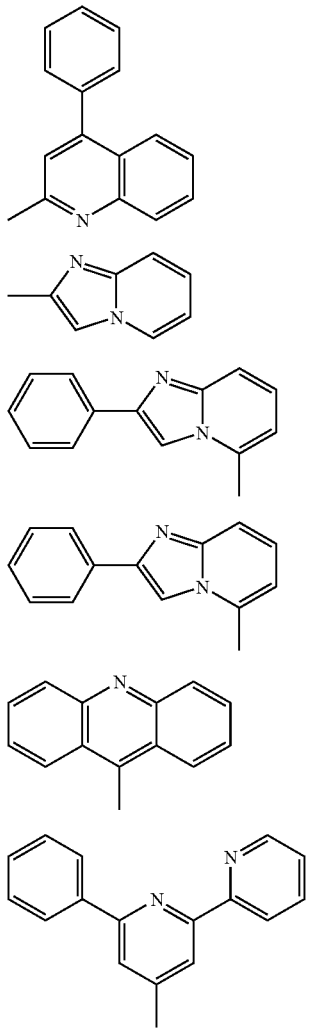

(39)

(40)

(41)

(42)

(43)

(44)

It is preferable that, in general formula (1), L represents a group represented by one of the following formulae (45) and (46):

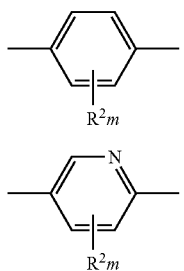

(45)

(46)

wherein $R^2$ represents a substituted or unsubstituted aryl group having 6 to 40 carbon atoms, a substituted or unsubstituted heteroaryl group having 3 to 40 carbon atoms, a substituted or unsubstituted alkyl group having 1 to 20 carbon atoms or a substituted or unsubstituted alkoxyl group having 1 to 20 carbon atoms, m represents an integer of 0 to 4 and, when m represents an integer of 2 or greater, a plural $R^2$ may represent the same group or different groups, and a plural group represented by $R^2$ may be bonded to each other to form a cyclic structure.

Examples of the aryl group, the heteroaryl group, the alkyl group and the alkoxyl group include the groups described above as the examples of the corresponding groups.

It is preferable that, in general formula (1), $Ar^2$ represents a group represented by one of the following formulae (47) to (53):

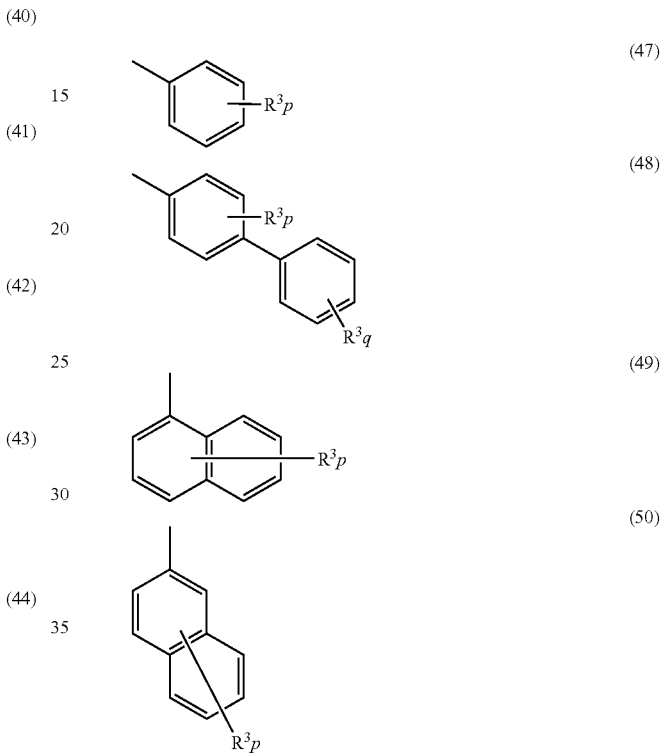

(47)

(48)

(49)

(50)

(51)

(52)

(53)

wherein $R^3$ represents a substituted or unsubstituted aryl group having 6 to 40 carbon atoms, a substituted or unsubstituted heteroaryl group having 3 to 40 carbon atoms, a substituted or unsubstituted alkyl group having 1 to 20 carbon atoms or a substituted or unsubstituted alkoxyl group having 1 to 20 carbon atoms, p represents an integer of 0 to 9, q represents an integer of 0 to 5 and, when p or p+q represents an integer of 2 or greater, a plural $R^3$ may represent the same group or different groups, and a plural group represented by $R^3$ may be bonded to each other to form a cyclic structure.

Examples of the aryl group, the heteroaryl group, the alkyl group and the alkoxyl group include the groups described above as the examples of the corresponding groups.

It is preferable that, in general formula (1), $Ar^1$ represents a group represented by one of the following formulae (54) and (55):

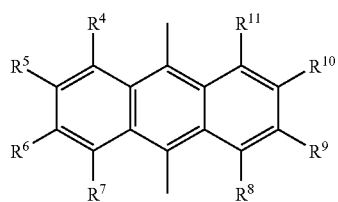

(54)

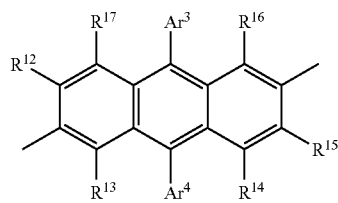

(55)

wherein $R^4$ to $R^{17}$ each independently represent hydrogen atom, a halogen atom, a substituted or unsubstituted aryl group having 6 to 40 carbon atoms, a substituted or unsubstituted aryloxyl group having 6 to 40 carbon atoms, a substituted or unsubstituted heteroaryl group having 3 to 40 carbon atoms, a substituted or unsubstituted alkyl group having 1 to 20 carbon atoms or a substituted or unsubstituted alkoxyl group having 1 to 20 carbon atoms, and $Ar^3$ and $Ar^4$ each represent a substituted or unsubstituted aryl group having 6 to 40 carbon atoms or a substituted or unsubstituted heteroaryl group having 3 to 40 carbon atoms.

Examples of the aryl group, the heteroaryl group, the alkyl group and the alkoxyl group include the groups described above as the examples of the corresponding groups. Examples of the halogen atom include fluorine atom, chlorine atom, bromine atom and iodine atom.

Examples of the heterocyclic derivative having silicon atom comprised in the electron transporting layer in the present invention include the compounds described in Japanese Patent Application Laid-Open No. Heisei 09(1997)-194487.

Examples of the above compound include silacyclopentadiene derivatives represented by the following general formula:

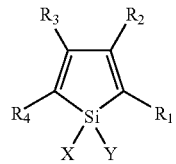

wherein X and Y each independently represents a saturated or unsaturated hydrocarbon group having 1 to 6 carbon atoms, an alkoxyl group, an alkenyloxyl group, an alkynyloxyl group, a substituted or unsubstituted aryl group, a substituted or unsubstituted heterocyclic group or a saturated or unsaturated cyclic group formed by bonding of the above groups represented by X and Y; and $R_1$ to $R_4$ each independently represent hydrogen atom, a halogen atom, a substituted or unsubstituted alkyl group having 1 to 6 carbon atoms, an alkoxyl group, an aryloxyl group, a perfluoroalkyl group, a perfluoroalkoxyl group, an amino group, an alkylcarbonyl group, an arylcarbonyl group, an alkoxycarbonyl group, an aryloxycarbonyl group, an azo group, an alkylcarbonyloxyl group, an arylcarbonyloxyl group, an alkoxycarbonyloxyl group, an aryloxycarbonyloxyl group, sulfinyl group, sulfonyl group, sulfanyl group, silyl group, carbamoyl group, an aryl group, a heterocyclic group, an alkenyl group, an alkynyl group, nitro group, formyl group, nitroso group, formyloxyl group, isocyano group, cyanate group, isocyanate group, thiocyanate group, isothiocyanate group, a cyano group or, when the groups are adjacent to each other, a structure formed by condensation of substituted or unsubstituted rings. However, when $R_1$ and $R_4$ represent phenyl group, X and Y do not represent alkyl groups or phenyl groups. When $R_1$ and $R_4$ represent thienyl group, X and Y represent monovalent hydrocarbon groups, and $R_2$ and $R_3$ represent alkyl groups, aryl groups alkenyl groups or a structure formed by bonding of the groups represented by $R_2$ and $R_3$ in which the structures derived from the groups represented by $R_2$ and $R_3$ do not satisfy the condition of the aliphatic group simultaneously. When $R_1$ and $R_4$ represent silyl groups, $R_2$, $R_3$, X and Y each independently do not represent a monovalent hydrocarbon group having 1 to 6 carbon atoms or hydrogen atom. When $R_1$ and $R_2$ represent in combination a structure formed by condensation of the benzene rings, X and Y do not represent alkyl groups or phenyl groups.

In the construction of the organic EL device of the present invention, the hole injecting layer and the electron injecting layer are not always necessary. However, the device comprising these layers has an advantage in that the light emitting property is improved. As another construction, a hole transporting layer (a hole injecting layer), a light emitting layer and an electron injecting layer may be disposed between the pair of electrodes in a mixed form. A mixed layer may be formed using a binder such as a macromolecular compound so that the constituting components can be present with stability.

The organic EL device of the present invention will be described with reference to an embodiment having a construction of an anode/a hole transporting layer/a light emitting layer/an electron transporting layer/a cathode. It is preferable that the organic EL device of the present invention is supported with a substrate. The substrate is not particularly limited, and a substrate conventionally used for organic EL devices such as glass, a transparent plastic material and quartz can be used.

As the anode in the organic EL device, an anode using a metal, an alloy, an electrically conductive compound or a mixture of these substances, which has a great work function (4 eV or greater), as the electrode material is preferable. Examples of the electrode material include metals such as Au and conductive transparent materials such as CuI, ITO, $SnO_2$ and ZnO. The anode can be prepared by forming a thin film of the electrode material described above in accordance with a process such as the vapor deposition process and the sputtering process. When the light emitted from the light emitting layer is obtained through the anode, it is preferable that the anode has a transmittance of the emitted light greater than 10%. It is also preferable that the sheet resistivity of the anode is several hundred $\Omega/\square$ or smaller. The thickness of the anode is, in general, selected in the range of 10 nm to 1 μm and preferably in the range of 10 to 200 nm although the preferable range may be different depending on the used material.

As the cathode, a cathode using a metal, an alloy, an electrically conductive compound or a mixture of these substances, which has a small work function (4 eV or smaller), as the electrode material is preferable. Examples of the electrode material include sodium, sodium-potassium alloys, magnesium, magnesium-silver alloys, lithium, magnesium/copper mixtures, magnesium-indium alloys, $Al/Al_2O_3$, indium and aluminum-lithium alloys. The cathode can be prepared by forming a thin film of the electrode material described above in accordance with a process such as the vapor deposition process and the sputtering process. It is preferable that the sheet resistivity as the electrode is several hundred $\Omega/\square$ or smaller. The thickness is selected, in general, in the range of 10 to 500 nm and preferably in the range of 50 to 200 nm. Since the emitted light is obtained through an electrode, it is advantageous that one of the anode and the cathode of the organic EL device is transparent or translucent so that the efficiency of light emission is increased.

As the light emitting material constituting the light emitting layer in the organic EL device of the present invention, a host material is used as described above. As the host material, the dopants can be used as described above, and a light emitting material selected as desired from conventional light emitting materials can also be used. As the conventional light emitting material, for example, polycyclic condensed aromatic compounds, fluorescent whitening agents such as benzoxazole-based agents, benzothiazole-based agents and benzimidazole-based agents, metal chelated oxanoid compounds and distyrylbenzene-based compounds, which provide excellent thin films, can be used. Examples of the polycyclic condensed aromatic compound include condensed cyclic light emitting substances having a skeleton structure derived from anthracene, naphthalene, phenanthrene, pyrene, chrysene or perylene and other condensed cyclic light emitting substances having about 8 condensed rings. Specifically, 1,1,4,4-tetraphenyl-1,3-butadiene and 4,4'-(2,2-diphenyl-vinyl)biphenyl can be used. The light emitting layer may be constituted with a single layer comprising a single type or a plural type of the above light emitting material or may be a laminate of the above light emitting layer with light emitting layers comprising compounds other than those described above.

The hole transporting layer (the hole injecting layer) in the organic EL device of the present invention comprises a hole transporting compound and exhibits the function of transporting the hole injected from the anode to the light emitting layer. Due to the hole injecting layer disposed between the anode and the light emitting layer, a greater amount of holes can be injected into the light emitting layer under a lower applied electric field. Moreover, the electrons injected into the light emitting layer from the cathode or the electron injecting layer are accumulated in the interfacial region in the light emitting layer due to the electron barrier existing at the interface between the light emitting layer and the hole transporting layer (the hole injecting layer), and a device exhibiting a more excellent light emitting property such as an increased efficiency of light emission can be obtained. The hole transporting compound used for the hole transporting layer (the hole injecting layer) is a compound which is disposed between the two electrodes to which an electric field is applied and can suitably transport holes to the light emitting layer when the holes are injected from the anode. For example, compounds having a mobility of holes of at least $10^{-6}$ $cm^2/V \cdot sec$ under application of an electric field of $10^4$ to $10^6$ V/cm are preferable. The hole transporting compound is not particularly limited as long as the compound has the above preferable property. The hole transporting compound can be selected as desired from compounds conventionally used as the material for charge injection and transportation in photoconductive materials and conventional compounds used for the hole transporting layer (the hole injecting layer) of organic EL devices.

Examples of the hole transporting compound include copper phthalocyanine, N,N,N',N'-tetraphenyl-4,4'-diaminophenyl, N,N'-diphenyl-N,N'-di(3-methylphenyl)-4,4'-diaminobiphenyl (TPDA), 2,2-bis(4-di-p-tolylaminophenyl)propane, 1,1-bis(4-di-p-tolylaminophenyl)cyclohexane and N,N,N',N'-tetra-p-tolyl-4,4'-diaminobiphenyl. Crystals and amorphous materials of inorganic semiconductors such as Si, SiC and CdS can also be used. The hole injecting layer may be constituted with a single layer comprising a single type or a plural type of the above hole injecting material or may be a laminate of the above hole injecting layer with hole injecting layers comprising compounds other than those described above.

As a preferable embodiment of the organic EL device of the present invention, the organic EL device may comprise a reducing dopant in the region of transporting electrons or in the interface region of the cathode and an organic compound layer. In the present invention, an organic EL device in which the compound of the present invention comprises a reducing dopant is preferable. The reducing dopant is defined as a substance which can reduce a compound having the electron transporting property. Therefore, various compounds can be used as the reducing dopant as long as the compounds have a prescribed reducing property. For example, at least one substance selected from the group consisting of alkali metals, alkaline earth metals, rare earth metals, oxides of alkali metals, halides of alkali metals, oxides of alkaline earth metals, halides of alkaline earth metals, oxides of rare earth metals, halides of rare earth metals, organic complexes of alkali metals, organic complexes of alkaline earth metals and organic complexes of rare earth metals is preferable.

As the reducing dopant, substances having a work function of 2.9 eV or smaller are preferable. Specifically, at least one alkali metal selected from the group consisting of Na (the work function: 2.36 eV), K (the work function: 2.28 eV), Rb (the work function: 2.16 eV) and Cs (the work function: 1.95 eV) and at least one alkaline earth metal selected from the group consisting of Ca (the work function: 2.9 eV), Sr (the work function: 2.0 to 2.5 eV) and Ba (the work function: 2.52 eV), are preferable. Among the above substances, at least one alkali metal selected from the group consisting of K, Rb and Cs is more preferable, Rb and Cs are still more preferable, and Cs is most preferable as the reducing dopant. These alkali metals have great reducing ability, and the luminance of the emitted light and the lifetime of the organic EL device can be increased by addition of a relatively small amount of the alkali metal into the electron injecting zone. As the reducing dopant having a work function of 2.9 eV or smaller, combinations of two or more alkali metals are also preferable. Combinations having Cs as a component such as the combinations of Cs and Na, Cs and K, Cs and Rb and Cs, Na and K are more preferable. The reducing ability can be efficiently exhibited by the combination having Cs as a component. The luminance of emitted light and the lifetime of the organic EL device can be increased by adding the combination having Cs as a component into the electron injecting zone. The same effects can be exhibited by using some compounds other than the alkali metals, such as at least one metal compound selected from the group consisting of chalcogenides of alkali metals, chalcogenides of alkaline earth metals, halides of alkali metals and halides of alkaline earth metals. The same effects can also be exhibited by using a metal compound selected from organic complexes of alkali metals and organic complexes of alkaline earth metals.

The organic EL device of the present invention may further comprise an electron injecting layer which is constituted with an insulating material or a semiconductor and disposed between the cathode and the organic layer. By disposing the electron injecting layer, leak of the electric current can be effectively prevented, and the electron injecting property can be improved. As the insulating material, at least one metal compound selected from the group consisting of chalcogenides of alkali metals, chalcogenides of alkaline earth metals, halides of alkali metals and halides of alkaline earth metals is preferable. It is preferable that the electron injecting layer is constituted with the above metal compound since the electron injecting property can be further improved. Preferable examples of the chalcogenide of an alkali metal include $Li_2O$, $LiO$, $Na_2S$, $Na_2Se$ and $NaO$. Preferable examples of the chalcogenide of an alkaline earth metal include $CaO$, $BaO$, $SrO$, $BeO$, $BaS$ and $CaSe$. Preferable examples of the halide of an alkali metal include $LiF$, $NaF$, $KF$, $LiCl$, $KCl$ and $NaCl$. Preferable examples of the halide of an alkaline earth metal include fluoride such as $CaF_2$, $BaF_2$, $SrF_2$, $MgF_2$ and $BeF_2$ and halides other than the fluorides.

Examples of the semiconductor constituting the electron transporting layer include oxides, nitrides and oxide nitrides comprising at least one element selected from Ba, Ca, Sr, Yb, Al, Ga, In, Li, Na, Cd, Mg, Si, Ta, Sb and Zn used singly or in combination of two or more. It is preferable that the inorganic compound constituting the electron transporting layer forms a finely crystalline or amorphous insulating thin film. When the electron injecting layer is constituted with the insulating thin film described above, a more uniform thin film can be formed, and defects of pixels such as dark spots can be decreased. Examples of the inorganic compound include chalcogenides of alkali metals, chalcogenides of alkaline earth metals, halides of alkali metals and halides of alkaline earth metals which are described above.

The process for preparing the organic EL device of the present invention will be described in the following. As a preferable embodiment, a process for preparing an organic EL device having a construction of an anode/a hole transporting layer/a light emitting layer/an electron transporting layer/a cathode, which is described above, will be described in the following. On a suitable substrate, a thin film made of a material for the anode is formed in accordance with the vapor deposition process or the sputtering process so that the thickness of the formed thin film is 1 μm or smaller and preferably in the range of 10 to 200 nm. The formed thin film is used as the anode. On the formed anode, a hole transporting layer, a plural emitting layer and an electron transporting layer as the constituting elements of the EL device are formed by successively laminating thin layers comprising the respective constituting materials. As the process for the formation of the thin layers, the spin coating process, the casting process or the vapor deposition process can be used as described above. The vacuum vapor deposition process is preferable since a uniform film can be easily obtained and the possibility of formation of pin holes is small. When the thin layers are formed in accordance with the vacuum vapor deposition process, in general, it is preferable that the conditions are suitably selected in the following ranges: the temperature of heating the port: 50 to 400° C.; the degree of vacuum: $10^{-6}$ to $10^{-3}$ Pa; the rate of deposition: 0.01 to 50 nm/second; the temperature of the substrate: −50 to 300° C.; and the thickness of the film: 5 nm to 5 μm; although the conditions of the vacuum vapor deposition are different depending on the type of the used compound and the crystal structure and the aggregation structure of the molecular accumulation film to be formed. After these layers are formed, a thin layer having a thickness of 1 μm or smaller and preferably in the range of 50 to 200 nm and comprising the substance for the cathode is formed in accordance with the vapor deposition process or the sputtering process to form the cathode, and the desired organic EL device can be obtained. The organic EL device may be prepared by forming the above layers in the order reverse to that described above, i.e., in the order of the cathode, the electron transporting layer, the light emitting layer, the hole transporting layer and the anode.

EXAMPLES

The present invention will be described more specifically with reference to examples in the following. However, the present invention is not limited to the examples.

The energy gap and the ionization potential of a compound were measured in accordance with the following methods.

(1) Measurement of the Energy Gap (Eg)

The energy gap of the excited singlet was measured. An absorption spectrum of a toluene solution ($10^{-5}$ mole/liter) of a sample was obtained using an ultraviolet visible absorptiometer manufactured by HITACHI SEISAKUSHO Co., Ltd. A tangent was drawn to the increasing curve of the spectrum at the side of the long wavelength, and the wavelength at the intersection of the tangent with the abscissa (the end of the absorption) was obtained. The obtained wavelength was converted into the energy value.

(2) Measurement of the Ionization Potential (Ip)

A curve showing the change in the discharge of photoelectrons with the photon energy of irradiation was obtained with respect to a compound for the measurement using an atmospheric photoelectron spectrometer AC-1 manufactured by RIKEN KEIKI Co., Ltd., and the threshold value of the discharge of photoelectrons was obtained from the obtained curve in accordance with the extrapolation method.

Example 1

Preparation of an Organic EL Device of the Laminate Type having a Portion of a Light Emitting Layer Emitting Blue Light/a Light Emitting Layer Emitting Yellow Light A glass substrate of 25 mm×75 mm×1.1 mm thickness having an ITO transparent electrode (manufactured by GEOMATEC Company) was cleaned by application of ultrasonic wave in isopropyl alcohol for 5 minutes and then by exposure to ozone generated by ultraviolet light for 30 minutes. The cleaned glass substrate having the transparent electrode was attached to a substrate holder of a vacuum vapor deposition apparatus. On the surface of the cleaned substrate at the side having the transparent electrode, a film of N,N'-bis(N,N'-diphenyl-4-aminophenyl)-N,N-diphenyl-4,4'-diamino-1,1'-biphenyl (referred to as "TPD232", hereinafter) having a thickness of 60 nm was formed in a manner such that the formed film covered the transparent electrode. The formed TPD232 film worked as the hole injecting layer. On the formed TPD232 film, a film of N,N,N',N'-tetra(4-biphenyl)diaminobipbenyl (referred to as "TBTB", hereinafter; Ip=5.5 eV; Eg=3.1 eV) having a thickness of 20 nm was formed. The formed TBTB film worked as the hole transporting layer. On the formed TBTB film, 4',4"-bis(2,2-diphenylvinyl)-9,10-diphenylanthracene (referred to as "DPVDPAN", hereinafter) (Ip=5.7 eV; Eg=3.0 eV) as the styryl derivative and Compound B1 shown in the following (the peak of light emission: 470 nm; Ip=5.5 eV; Eg=2.8 eV) as the dopant compound were vapor deposited simultaneously to form a film having a thickness of 10 nm in which the ratio of the thickness of the DPVDPAN film to the thickness of the Compound B1 film was 40:2. The formed film was used as the first light emitting layer (the light emitting layer emitting blue light). Then, DPVDPAN (Ip=5.7 eV; Eg=3.0 eV) as the styryl derivative and Compound R1 shown in the following (the peak of light emission: 560 nm; Ip=5.6 eV; Eg=2.6 eV) as the dopant compound were vapor deposited simultaneously to form a film having a thickness of 30 nm in which the ratio of the thickness of the DPVDPAN film to the thickness of the Compound R1 film was 40:2. The formed film was used as the second light emitting layer (the light emitting layer emitting yellow light). On the formed film, a film of ETM20 (Ip=5.7 eV; Eg=3.0 eV) having a thickness of 20 nm was formed as an electron transporting layer. Then, LiF was vapor deposited to form a film having a thickness of 1 nm in accordance with the resistance heating method, and an electron injecting cathode was formed. On the formed film, metallic aluminum was vapor deposited to form a film having a thickness of 150 nm so that a metal cathode was formed. Thus, an organic EL device emitting white light was prepared.

The obtained organic EL device was examined by passing electric current. White light having a luminance of light emission of 1,000 nit was obtained at a voltage of 5.0 V and a current density of 11.0 mA/cm$^2$. The chromaticity coordinates were (0.33, 0.33), and the efficiency of light emission was 9.1 cd/A and 5.7 lumen/W. The luminance was measured after being driven for 1,500 hours at the room temperature under the condition of the initial luminance of 1,000 nit and was found to be 700 nit.

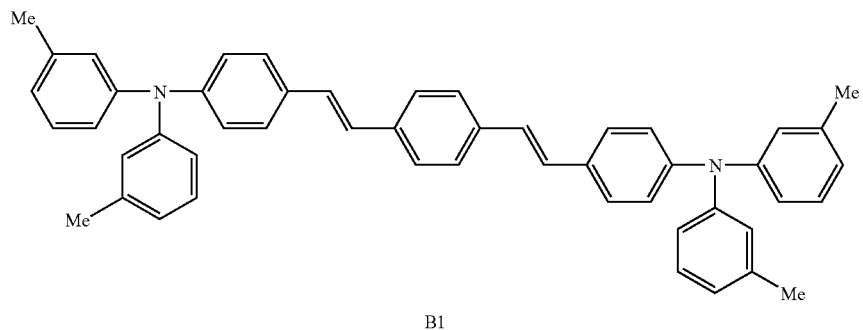

B1

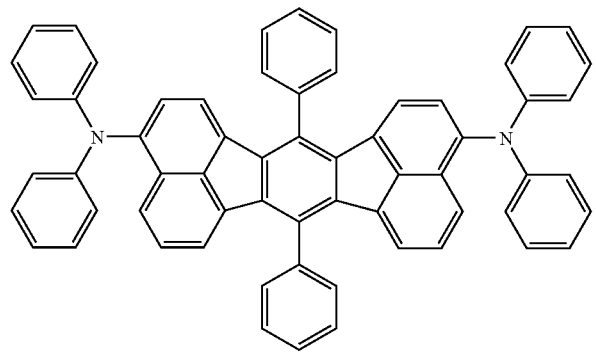

R1

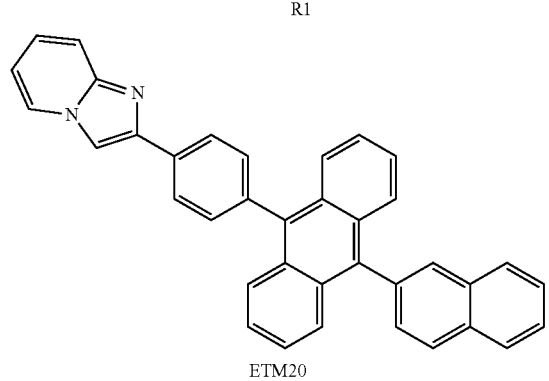

ETM20

Example 2

Preparation of an Organic EL Device of the Laminate Type having a Portion of a Light Emitting Layer Emitting Blue Light/a Light Emitting Layer Emitting Yellow Light/a Light Emitting Layer Emitting Blue Light An organic EL device emitting white light was prepared in accordance with the same procedures as those conducted in Example 1 except that the light emitting layers were prepared as described in the following.

On the TBTB film, DPVDPAN (Ip=5.7 eV; Eg=3.0 eV) as the styryl derivative and Compound B1 shown above (the peak of light emission: 470 nm; Ip=5.5 eV; Eg=2.8 eV) as the dopant compound were vapor deposited simultaneously to form a film having a thickness of 10 nm in which the ratio of the thickness of the DPVDPAN film to the thickness of the Compound B1 film was 40:2. The formed film was used as the first light emitting layer (the light emitting layer emitting blue light). Then, DPVDPAN (Ip=5.7 eV; Eg=3.0 eV) as the styryl derivative and Compound R1 shown above (the peak of light emission: 560 nm; Ip=5.6 eV; Eg=2.6 eV) as the dopant compound were vapor deposited simultaneously to form a film having a thickness of 10 nm in which the ratio of the thickness of the DPVDPAN film to the thickness of the Compound R1 film was 40:2. The formed film was used as the second light emitting layer (the light emitting layer emitting yellow light). Thereafter, DPVDPAN (Ip=5.7 eV; Eg=3.0 eV) as the styryl derivative and Compound B1 shown above (the peak of light emission: 470 nm; Ip=5.5 eV; Eg=2.8 eV) as the dopant compound were vapor deposited simultaneously to form a film having a thickness of 20 nm in which the ratio of the thickness of the DPVDPAN film to the thickness of the Compound B1 film was 40:2. The formed film was used as the third light emitting layer (the light emitting layer emitting blue light).

The obtained organic EL device was examined by passing electric current. White light having a luminance of light emission of 1,000 nit was obtained at a voltage of 4.5 V and a current density of 10.0 mA/cm$^2$. The chromaticity coordinates were (0.28, 0.35), and the efficiency of light emission was 10.0 cd/A and 7.0 lumen/W. The luminance was measured after being driven for 1,500 hours at the room temperature under the condition of the initial luminance of 1,000 nit and was found to be 600 nit.

Example 3

Preparation of an Organic EL Device of the Laminate Type having a Portion of a Light Emitting Layer Emitting Yellow Light/a Light Emitting Layer Emitting Blue Light/a Light Emitting Layer Emitting Yellow Light An organic EL device emitting white light was prepared in accordance with the same procedures as those conducted in Example 1 except that the light emitting layers were prepared as described in the following.

On the TBTB film, DPVDPAN (Ip=5.7 eV; Eg=3.0 eV) as the styryl derivative and Compound R1 shown above (the peak of light emission: 560 nm; Ip=5.6 eV; Eg=2.6 eV) as the dopant compound were vapor deposited simultaneously to form a film having a thickness of 10 nm in which the ratio of the thickness of the DPVDPAN film to the thickness of the Compound R1 film was 40:2. The formed film was used as the first light emitting layer (the light emitting layer emitting yellow light). Then, DPVDPAN (Ip=5.7 eV; Eg=3.0 eV) as the styryl derivative and Compound B1 shown above (the peak of light emission: 470 nm; Ip=5.5 eV; Eg=2.8 eV) as the dopant compound were vapor deposited simultaneously to form a film having a thickness of 10 nm in which the ratio of the thickness of the DPVDPAN film to the thickness of the Compound B1 film was 40:2. The formed film was used as the second light emitting layer (the light emitting layer emitting blue light). Thereafter, DPVDPAN (Ip=5.7 eV; Eg=3.0 eV) as the styryl derivative and Compound R1 shown above (the peak of light emission: 560 nm; Ip=5.6 eV; Eg=2.6 eV) as the dopant compound were vapor deposited simultaneously to form a film having a thickness of 20 nm in which the ratio of the thickness of the DPVDPAN film to the thickness of the Compound R1 film was 40:2. The formed film was used as the third light emitting layer (the light emitting layer emitting yellow light).

The obtained organic EL device was examined by passing electric current. White light having a luminance of light emission of 1,000 nit was obtained at a voltage of 5.3 V and a current density of 11.0 mA/cm$^2$. The chromaticity coordinates were (0.32, 0.35), and the efficiency of light emission was 9.1 cd/A and 5.4 lumen/W. The luminance was measured after being driven for 1,500 hours at the room temperature under the condition of the initial luminance of 1,000 nit and was found to be 800 nit.

Comparative Example 1

Preparation of an Organic EL Device of the Laminate Type having a Portion of a Light Emitting Layer Emitting Blue Light/a Light Emitting Layer Emitting Green to Red Light A glass substrate (manufactured by GEOMATEC Company) of 25 mm×75 mm×1.1 mm thickness having an ITO transparent electrode was cleaned by application of ultrasonic wave in isopropyl alcohol for 5 minutes and then by exposure to ozone generated by ultraviolet light for 30 minutes. The cleaned glass substrate having the transparent electrode was attached to a substrate holder of a vacuum vapor deposition apparatus. On the surface of the cleaned substrate at the side having the transparent electrode, a TPD232 film having a thickness of 60 nm was formed in a manner such that the formed film covered the transparent electrode. The formed TPD232 film worked as the hole injecting layer. On the formed TPD232 film, a film of 4,4'-bis[N-(1-naphthyl)-N-phenylamino]biphenyl (referred to as "NPD", hereinafter) having a thickness of 20 nm was formed. The formed NPD film worked as the hole transporting layer. On the formed NPD film, DPVDPAN (Ip=5.7 eV; Eg=3.0 eV) as the styryl derivative and Compound B1 shown above (Ip=5.5 eV; Eg=2.8 eV) as the dopant compound were vapor deposited simultaneously to form a film having a thickness of 20 nm in which the ratio of the thickness of the DPVDPAN film to the thickness of the Compound B1 film was 20:1.5. The formed film was used as the light emitting layer emitting blue light. Then, DPVDPAN as the styryl derivative and Compound R1 shown above were vapor deposited simultaneously to form a film having a thickness of 20 nm in which the ratio of the thickness of the DPVDPAN film to the thickness of the Compound R1 film was 20:1. The formed film was used as the light emitting layer emitting green to red light. On the formed film, a film of t-BuPBD shown in the following (Ip=6.1 eV; Eg=3.1 eV) having a thickness of 20 nm was formed as an electron transporting layer. Then, LiF (the source of lithium: manufactured by SAES GETTERS Company) was vapor deposited to form a film having a thickness of 1 nm. On the formed film, metallic aluminum was vapor deposited to form a film having a thickness of 150 nm so that a metal cathode was formed. Thus, an organic EL device was prepared.

The obtained organic EL device was examined by passing electric current. Light having a luminance of light emission of 110 nit was obtained at a voltage of 7.0 V and a current density of 2.0 mA/cm$^2$. The chromaticity coordinates were (0.25, 0.33), and the efficiency of light emission was 5.5 cd/A and 2.5 lumen/W. The luminance was measured after being driven for 1,500 hours at the room temperature under the condition of the initial luminance of 1,000 nit and was found to be 300 nit.

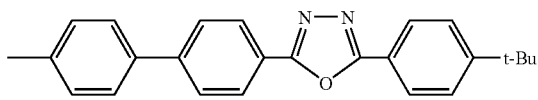

t-BuPBD (t-Bu represents t-butyl group.)

Example 4

Preparation of an Organic EL Device of the Laminate Type having a Portion of a Light Emitting Layer Emitting Blue Light/a Light Emitting Layer Emitting Yellow Light An organic EL device emitting white light was prepared in accordance with the same procedures as those conducted in Example 1 except that ETM30 (a benzimidazole-based compound) (Ip=5.7 eV; Eg=3.0 eV) was used for the electron transporting layer in place of ETM20.

The obtained organic EL device was examined by passing electric current. White light having a luminance of light emission of 1,150 nit was obtained at a voltage of 5.3 V and a current density of 10 mA/cm$^2$. The chromaticity coordinates were (0.28, 0.33), and the efficiency of light emission was 11.5 cd/A and 6.8 lumen/W. The luminance was measured after being driven for 1,500 hours at the room temperature under the condition of the initial luminance of 1,000 nit and was found to be 780 nit.

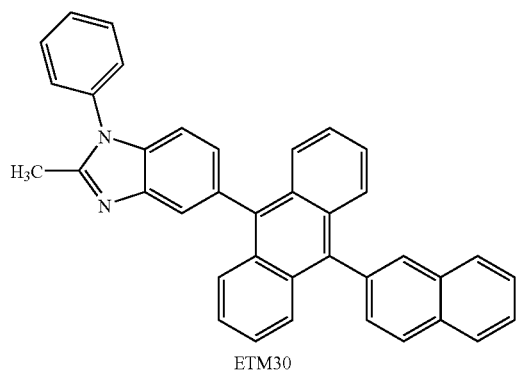

ETM30

Comparative Example 2

Preparation of an Organic EL Device of the Laminate Type having a Portion of a Light Emitting Layer Emitting Blue Light/a Light Emitting Layer Emitting Green to Red Light The same procedures as those conducted in Example 1 were conducted until the second light emitting layer was formed in accordance with the vapor deposition. Then, a layer of TPBI (Ip=6.1 eV; Eg=3.6 eV) having a thickness of 10 nm was formed as the electron transporting layer. Thereafter, Na was vapor deposited to form a film having a thickness of 0.5 nm using an alkali dispenser manufactured by SAES GETTERS Company so that an electron injecting cathode was formed. In accordance with the same procedures as those conducted in Example 1, metallic aluminum was vapor deposited on the formed film to form a film having a thickness of 150 nm so that a metal cathode was formed. Thus, an organic EL device emitting white light was prepared.

The obtained organic EL device was examined by passing electric current. White light having a luminance of light emission of 1,050 nit was obtained at a voltage of 5.0 V and a current density of 10 mA/cm$^2$. The chromaticity coordinates were (0.27, 0.33), and the efficiency of light emission was 10.5 cd/A and 6.6 lumen/W. The luminance was measured after being driven for 1,500 hours at the room temperature under the condition of the initial luminance of 1,000 nit and was found to be 300 nit.

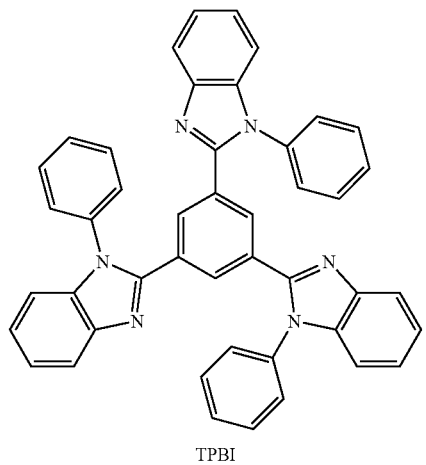

TPBI

Example 5

Preparation of an Organic EL Device of the Laminate Type having a Portion of a Light Emitting Layer Emitting Blue Light/a Light Emitting Layer Emitting Yellow Light/a Light Emitting Layer Emitting Blue Light The same procedures as those conducted in Example 1 were conducted until the second light emitting layer was formed in accordance with the vapor deposition. Then, a layer of ETM30 (Ip=5.7 eV; Eg=3.0 eV) having a thickness of 10 nm was formed as the electron transporting layer. Thereafter, Na was vapor deposited to form a film having a thickness of 0.5 nm using an alkali dispenser manufactured by SAES GETTERS Company so that an electron injecting cathode was formed.

In accordance with the same procedures as those conducted in Example 1, metallic aluminum was vapor deposited on the formed film to form a film having a thickness of 150 nm so that a metal cathode was formed. Thus, an organic EL device emitting white light was prepared.

The obtained organic EL device was examined by passing electric current at a current density of 10 mA/cm². The lifetime test was also conducted under the condition of the initial luminance of 1,000 nit. The results shown in Table 1 were obtained.

Example 6

Preparation of an Organic EL Device of the Laminate Type having a Portion of a Light Emitting Layer Emitting Blue Light/a Light Emitting Layer Emitting Yellow Light/a Light Emitting Layer Emitting Blue Light The same procedures as those conducted in Example 1 were conducted until the second light emitting layer was formed in accordance with the vapor deposition. Then, a layer of ETM30 having a thickness of 10 nm was formed as the electron transporting layer. Thereafter, ETM30 and Cs were vapor deposited simultaneously at rates of 1.0 Å/s and 0.1 Å/s, respectively, using an alkali dispenser manufactured by SAES GETTERS Company to form an electron injecting mixed cathode having a thickness of 10 nm. In accordance with the same procedures as those conducted in Example 1, metallic aluminum was vapor deposited on the formed film to form a film having a thickness of 150 nm so that a metal cathode was formed. Thus, an organic EL device emitting white light was prepared.

The obtained organic EL device was examined by passing electric current at a current density of 10 mA/cm². The lifetime test was also conducted under the condition of the initial luminance of 1,000 nit. The results shown in Table 1 were obtained.

Comparative Example 3

Preparation of an Organic EL Device of the Laminate Type having a Portion of a Light Emitting Layer Emitting Blue Light/a Light Emitting Layer Emitting Green to Red Light An organic EL device emitting white light was prepared in accordance with the same procedures as those conducted in Example 1 except that BCP was used for the electron transporting layer in place of ETM20.

The obtained organic EL device was examined by passing electric current, and the lifetime test was also conducted The results shown in Table 1 were obtained.

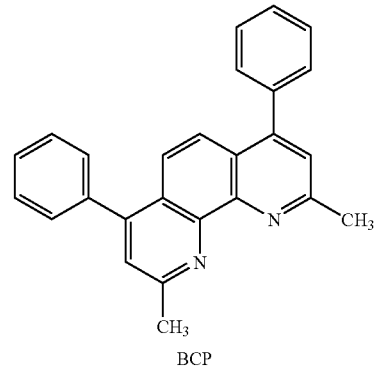

BCP

TABLE 1

|  | Voltage (V) | Luminance (cd/m²) | Chromaticity coordinates (CIEx, CIEy) | Efficiency of light emission (cd/A) | Efficiency of conversion of electric power (lumen/W) | Luminance after being driven for 1,500 hours (cd/m²) |
|---|---|---|---|---|---|---|
| Example 1 | 5.0 | 1,000 | (0.33, 0.33) | 9.1 | 5.7 | 700 |
| Example 2 | 4.5 | 1,000 | (0.28, 0.35) | 10.0 | 7.0 | 600 |
| Example 3 | 5.3 | 1,000 | (0.32, 0.35) | 9.1 | 5.4 | 800 |
| Comparative Example 1 | 7.0 | 110 | (0.25, 0.33) | 5.5 | 2.5 | 300 |
| Example 4 | 5.3 | 1,150 | (0.28, 0.33) | 11.5. | 6.59 | 780 |
| Comparative Example 2 | 5.0 | 1,050 | (0.27, 0.33) | 10.5 | 6.6 | 300 |
| Example 5 | 5.0 | 1,100 | (0.27, 0.33) | 11.0 | 6.91 | 850 |
| Example 6 | 5.1 | 1,250 | (0.27, 0.33) | 12.5 | 7.7 | 840 |
| Comparative Example 3 | 4.9 | 1,200 | (0.27, 0.33) | 12.0 | 7.69 | 450 |

As clearly shown in Table 1, it was found that, in Examples 1 to 4 in which relations (I), (II) and (III) required in the present invention were satisfied, the luminance after being driven for 1,500 hours was 600 nit or greater in all cases, which was twice or more as great as that in Comparative Examples 1 and 2, i.e., 300 nit. In particular, it was shown in Example 4 that ETM was excellent for the electron transporting layer.

In Example 5, the luminance after being driven for 1,500 hours was as excellent as 850 nit when relations (I), (II), and (III) were satisfied and Na was used for the electron injecting cathode. As shown in Comparative Example 2, when relation (III) was not satisfied, the luminance after being driven for 1,500 hours did not give a practically applicable value even when Na was used for the electron injecting cathode.

In Example 6, the luminance after being driven for 1,500 hours was as excellent as 860 nit when relations (I), (II), and (III) were satisfied and Cs was used for the electron injecting cathode. As shown in Comparative Example 3, when relation (III) was not satisfied, the luminance after being driven for 1,500 hours was not practical even when Cs was used for the electron injecting cathode.

INDUSTRIAL APPLICABILITY

The organic EL device emitting white light of the present invention provides a great efficiency of light emission under a low voltage, has a long lifetime and exhibits no change in the chromaticity. Therefore, the organic EL device emitting white light of the present invention is advantageous in the practical applications and very useful as the light source for various types of electronic instruments.

The invention claimed is:

1. An organic electroluminescence device emitting white light which comprises a pair of electrodes, at least two light emitting layers and an electron transporting layer comprising a heterocyclic derivative having a nitrogen atom, the light emitting layers and the electron transporting layer being between the pair of electrodes, wherein an energy gap of a host compound comprised in each light emitting layer Eg(Host-i) satisfies following relation (I):

$$2.9 \text{ eV} \leq Eg(\text{Host-}i) \tag{I}$$

wherein Eg(Host-i) represents an energy gap of a host compound comprised in an i-th light emitting layer from the electron transporting layer, i representing an integer of 1 to n, an energy gap of the heterocyclic derivative having a nitrogen atom comprised in the electron transporting layer Eg(ETM) satisfies following relation (II):

$$2.9 \text{ eV} < Eg(\text{ETM}) \tag{II}$$

and an ionization potential of a host compound comprised in a light emitting layer adjacent to the electron transporting layer (Ip(Host-1)) and an ionization potential of the heterocyclic derivative having a nitrogen atom comprised in the electron transporting layer (Ip(ETM)) satisfy following relation (III):

$$Ip(\text{ETM}) \leq Ip(\text{Host-1}) + 0.3 \text{ eV} \tag{III};$$

wherein the host compound is capable of emitting blue light and is selected from the group consisting of anthracene derivatives, styryl derivatives, aromatic amines, aluminum chelates having mixed ligands and carbazole derivatives;

the energy gap is an excited singlet energy gap which is determined by obtaining an absorption spectrum of a $10^{-5}$ mole/liter toluene solution of a sample using an ultraviolet visible absorption meter and converting a wavelength at an absorption end on the absorption spectrum into energy value; and the ionization potential is measured by obtaining a curve showing a change of discharged photoelectrons with a photon energy of irradiation using a photoelectron spectrometer, and determining by extrapolation a threshold value of the discharge of photoelectrons on the curve.

2. The organic electroluminescence device emitting white light according to claim 1, wherein the energy gap of a host compound comprised in each light emitting layer Eg(Host-i) and the energy gap of the heterocyclic derivative having a nitrogen atom comprised in the electron transporting layer Eg(ETM) satisfy following relation (IV):

$$2.9 \text{ eV} < Eg(\text{ETM}) \leq Eg(\text{Host-}i) \tag{IV}.$$

3. The organic electroluminescence device emitting white light according to claim 1, wherein at least one light emitting layer comprises a dopant having an energy gap of 2.9 eV or smaller.

4. The organic electroluminescence device emitting white light according to claim 1, which comprises at least two light emitting layers having different peak wavelengths of light emission.

5. The organic electroluminescence device emitting white light according to claim 1, wherein a difference between a greatest peak wavelength of light emission and a second greatest peak wavelength of light emission is 50 nm or greater.

6. The organic electroluminescence device emitting white light according to claim 1, wherein the electron transporting layer or an interfacial region between the electron transporting layer and a cathode comprises a metal having a work function of 2.8 eV or smaller or a compound of the metal.

7. The organic electroluminescence device emitting white light according to claim 6, wherein the metal is Na, K, Rb, Cs, Ca, Sr or Ba.

8. The organic electroluminescence device emitting white light according to claim 1, wherein the electron transporting layer comprises a heterocyclic derivative having a nitrogen atom represented by following general formula (1):

$$HAr\text{-}L\text{-}Ar^1\text{—}Ar^2 \tag{1}$$

wherein HAr represents a substituted or unsubstituted heterocyclic group having a nitrogen atom, $Ar^1$ represents a substituted or unsubstituted divalent aromatic hydrocarbon group having 6 to 40 carbon atoms, $Ar^2$ represents a substituted or unsubstituted aryl group having 6 to 40 carbon atoms or a substituted or unsubstituted heteroaryl group having 3 to 40 carbon atoms, and L represents a single bond or a substituted or unsubstituted arylene group.

9. The organic electroluminescence device emitting white light according to claim 8, wherein HAr represents a heterocyclic group represented by one of following formulae (2) to (24):

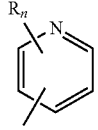

-continued

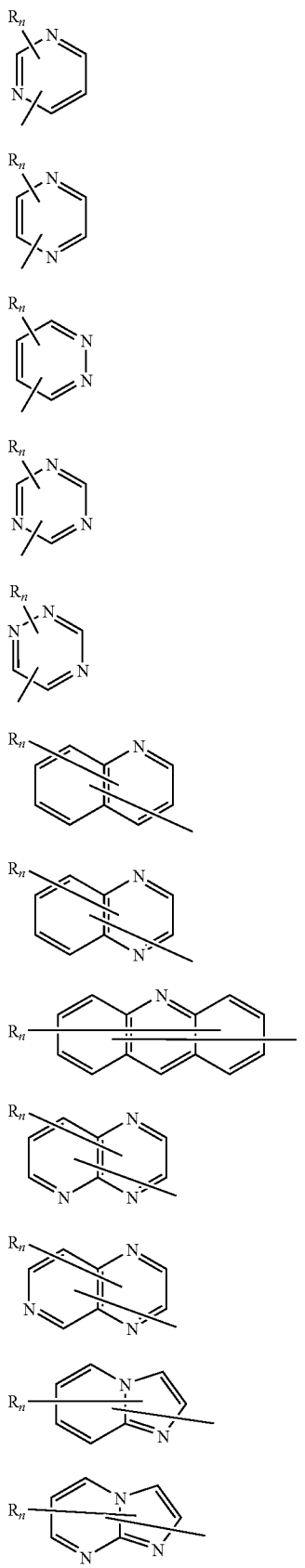
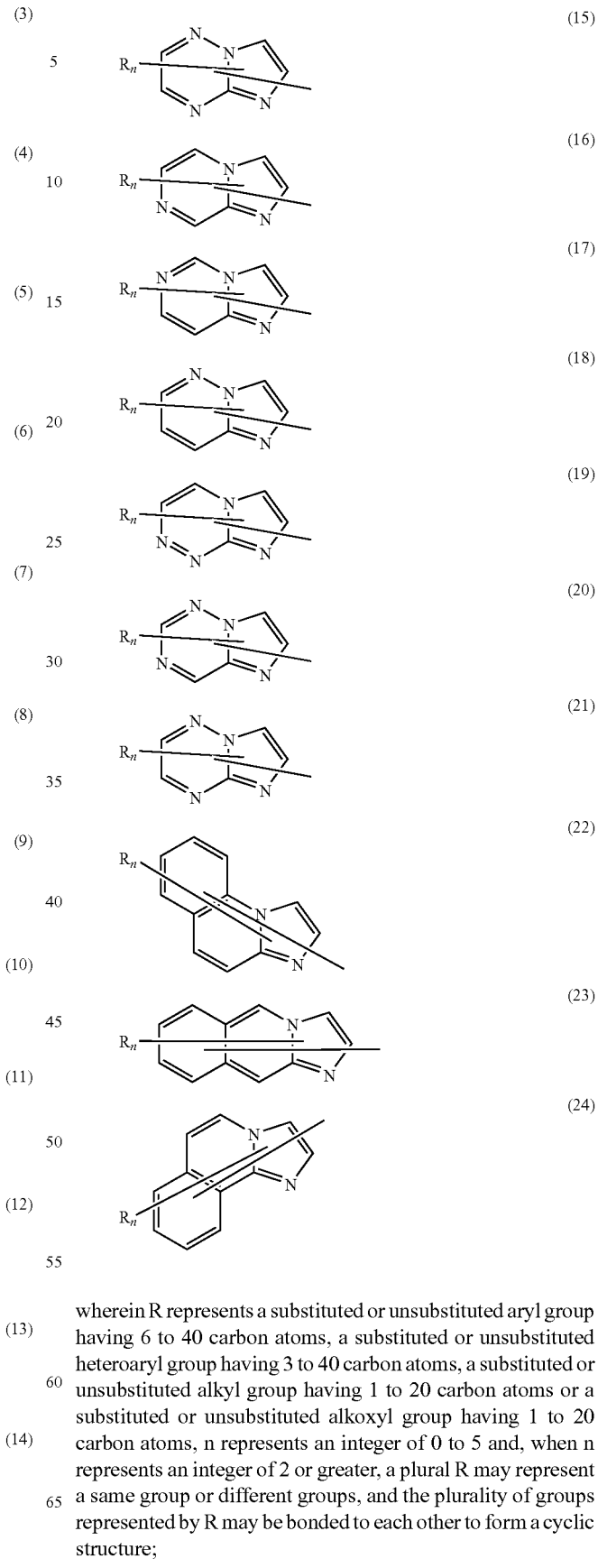

wherein R represents a substituted or unsubstituted aryl group having 6 to 40 carbon atoms, a substituted or unsubstituted heteroaryl group having 3 to 40 carbon atoms, a substituted or unsubstituted alkyl group having 1 to 20 carbon atoms or a substituted or unsubstituted alkoxyl group having 1 to 20 carbon atoms, n represents an integer of 0 to 5 and, when n represents an integer of 2 or greater, a plural R may represent a same group or different groups, and the plurality of groups represented by R may be bonded to each other to form a cyclic structure;

and formula (A):

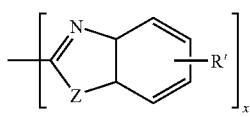

(A)

wherein a plural R¹ each independently represent hydrogen atom, a halogen atom, a substituted or unsubstituted alkyl group having 1 to 20 carbon atoms, a substituted or unsubstituted aryl group having 6 to 40 carbon atoms, a substituted or unsubstituted heteroaryl group having 3 to 40 carbon atoms or a group forming a condensed aromatic group, Z represents oxygen atom, sulfur atom or a group represented by NR', R' representing a same atom or group as that represented by R¹, and x represents an integer of 2 to 8;
or a substituted or unsubstituted carbazolyl group.

10. The organic electroluminescence device emitting white light according to claim 8, wherein HAr represents a group expressed by one of following formulae (25) to (44):

(25)

(26)

(27)

(28)

(29)

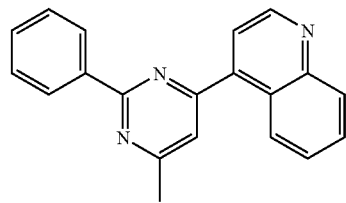

(30)

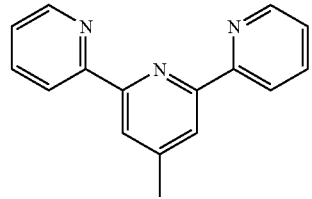

(31)

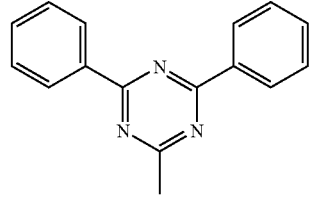

(32)

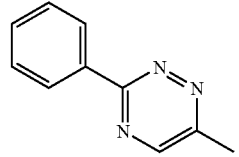

(33)

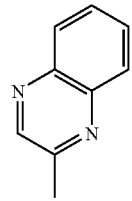

(34)

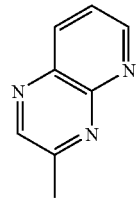

(35)

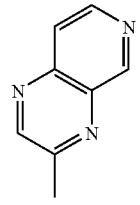

(36)

-continued

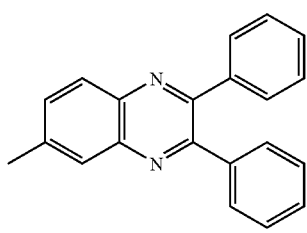
(37)

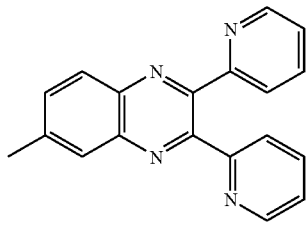
(38)

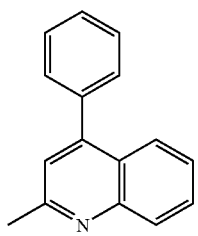
(39)

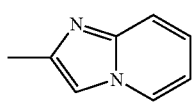
(40)

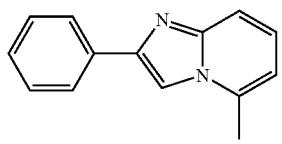
(41)

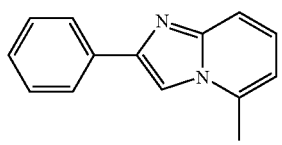
(42)

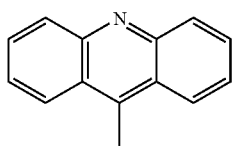
(43)

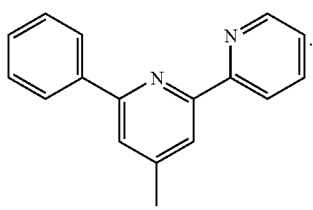
(44)

11. The organic electroluminescence device emitting white light according to claim 8, wherein L represents a group represented by one of following formulae (45) and (46):

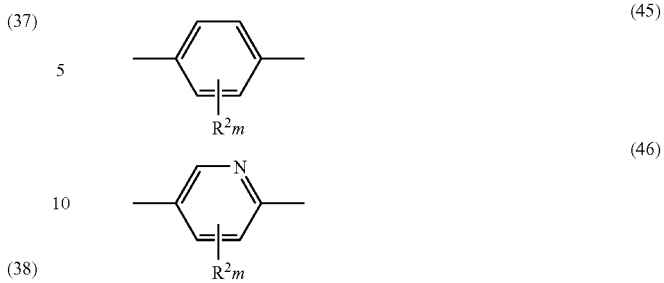
(45)
(46)

wherein $R^2$ represents a substituted or unsubstituted aryl group having 6 to 40 carbon atoms, a substituted or unsubstituted heteroaryl group having 3 to 40 carbon atoms, a substituted or unsubstituted alkyl group having 1 to 20 carbon atoms or a substituted or unsubstituted alkoxyl group having 1 to 20 carbon atoms, m represents an integer of 0 to 4 and, when m represents an integer of 2 or greater, a plural $R^2$ may represent a same group or different groups, and a plural group represented by $R^2$ may be bonded to each other to form a cyclic structure.

12. The organic electroluminescence device emitting white light according to claim 8, wherein $Ar^2$ represents a group represented by one of following formulae (47) to (53):

(47)

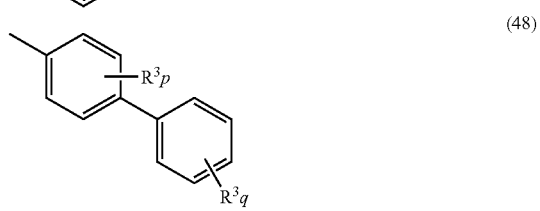
(48)

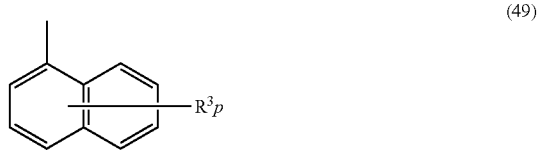
(49)

(50)

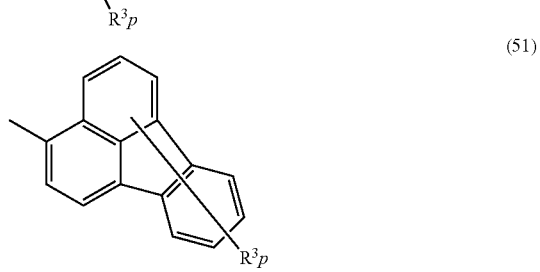
(51)

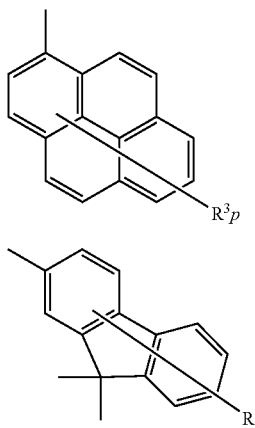

(52)

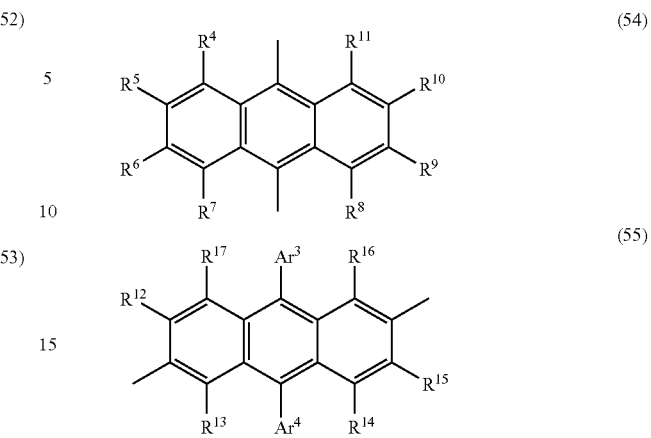

(54)

(53)

(55)

wherein R³ represents a substituted or unsubstituted aryl group having 6 to 40 carbon atoms, a substituted or unsubstituted heteroaryl group having 3 to 40 carbon atoms, a substituted or unsubstituted alkyl group having 1 to 20 carbon atoms or a substituted or unsubstituted alkoxyl group having 1 to 20 carbon atoms, p represents an integer of 0 to 9, q represents an integer of 0 to 5 and, when p or p+q represents an integer of 2 or greater, a plural R³ may represent a same group or different groups, and a plural group represented by R³ may be bonded to each other to form a cyclic structure.

13. The organic electroluminescence device emitting white light according to claim 8, wherein Ar¹ represents a group represented by one of following formulae (54) and (55):

wherein $R^4$ to $R^{17}$ each independently represent hydrogen atom, a halogen atom, a substituted or unsubstituted aryl group having 6 to 40 carbon atoms, a substituted or unsubstituted aryloxyl group having 6 to 40 carbon atoms, a substituted or unsubstituted heteroaryl group having 3 to 40 carbon atoms, a substituted or unsubstituted alkyl group having 1 to 20 carbon atoms or a substituted or unsubstituted alkoxyl group having 1 to 20 carbon atoms, and $Ar^3$ and $Ar^4$ each represent a substituted or unsubstituted aryl group having 6 to 40 carbon atoms or a substituted or unsubstituted heteroaryl group having 3 to 40 carbon atoms.

* * * * *